US012532604B2

(12) United States Patent
Naruse et al.

(10) Patent No.: US 12,532,604 B2
(45) Date of Patent: Jan. 20, 2026

(54) ORGANIC DEVICE, METHOD OF MANUFACTURING THE SAME, DISPLAY DEVICE, PHOTOELECTRIC CONVERSION DEVICE, ELECTRONIC APPARATUS, ILLUMINATION DEVICE, AND MOVING BODY

(71) Applicant: CANON KABUSHIKI KAISHA, Tokyo (JP)

(72) Inventors: Hiroaki Naruse, Kanagawa (JP); Koji Ishizuya, Kanagawa (JP); Yojiro Matsuda, Kanagawa (JP); Takayuki Ito, Kanagawa (JP); Hiroaki Sano, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 824 days.

(21) Appl. No.: 17/730,504

(22) Filed: Apr. 27, 2022

(65) Prior Publication Data

US 2022/0255042 A1    Aug. 11, 2022

Related U.S. Application Data

(63) Continuation of application No. PCT/JP2020/039132, filed on Oct. 16, 2020.

(30) Foreign Application Priority Data

Oct. 28, 2019   (JP) .................................. 2019-195526
Sep. 29, 2020   (JP) .................................. 2020-163887

(51) Int. Cl.
  *H10K 59/12*     (2023.01)
  *H10K 59/123*    (2023.01)
  (Continued)

(52) U.S. Cl.
  CPC ....... *H10K 59/1201* (2023.02); *H10K 59/878* (2023.02); *H10K 59/131* (2023.02); *H10K 59/80515* (2023.02); *H10K 59/876* (2023.02)

(58) Field of Classification Search
  CPC ............. H10K 59/1201; H10K 59/878; H10K 59/131; H10K 59/80515; H10K 59/123;
  (Continued)

(56) References Cited

U.S. PATENT DOCUMENTS 8,022,620 B2   9/2011   Kobayashi
8,093,808 B2   1/2012   Koshihara
  (Continued)

FOREIGN PATENT DOCUMENTS

CN       1832195 A     9/2006
CN     101055887 A    10/2007
  (Continued)

OTHER PUBLICATIONS

EP Communication issued on Sep. 20, 2023, in counterpart application EP 20882652.9 (12 pages).
  (Continued)

*Primary Examiner* — Mohsen Ahmadi
(74) *Attorney, Agent, or Firm* — VENABLE LLP

(57) ABSTRACT

An organic device includes a reflective film arranged on a substrate, a plurality of lower electrodes arranged above the reflective film, an organic function film configured to cover the plurality of lower electrodes, and an upper electrode arranged on the organic function film. A potential difference between the upper electrode and the reflective film is lower than a threshold voltage at which the organic function film operates.

24 Claims, 17 Drawing Sheets

(51) Int. Cl.
*H10K 59/124* (2023.01)
*H10K 59/131* (2023.01)
*H10K 59/38* (2023.01)
*H10K 59/80* (2023.01)
*H10K 102/00* (2023.01)

(58) Field of Classification Search
CPC .... H10K 59/38; H10K 59/124; H10K 50/856; H10K 2102/351
See application file for complete search history.

(56) References Cited

U.S. PATENT DOCUMENTS

| | | | |
|---|---|---|---|
| 8,129,712 | B2 | 3/2012 | Nishikawa et al. |
| 8,193,699 | B2 | 6/2012 | Fujioka et al. |
| 9,099,675 | B2 | 8/2015 | Ito |
| 9,391,129 | B2 | 7/2016 | Tokuda et al. |
| 9,647,238 | B2 | 5/2017 | Nozawa et al. |
| 10,044,000 | B2 | 8/2018 | Nozawa et al. |
| 10,608,208 | B2 | 3/2020 | Nozawa et al. |
| 10,957,876 | B2 | 3/2021 | Nozawa et al. |
| 11,271,058 | B2 | 3/2022 | Takahashi et al. |
| 11,404,673 | B2 | 8/2022 | Nozawa et al. |
| 11,882,724 | B2 | 1/2024 | Nozawa et al. |
| 2006/0192220 | A1 | 8/2006 | Nishikawa et al. |
| 2007/0241664 | A1 | 10/2007 | Sakamoto et al. |
| 2008/0203898 | A1 | 8/2008 | Kobayashi |
| 2009/0159906 | A1* | 6/2009 | Ishiguro ............... H10K 59/878 257/E33.072 |
| 2009/0284144 | A1 | 11/2009 | Fujioka et al. |
| 2010/0253222 | A1 | 10/2010 | Koshihara |
| 2012/0112234 | A1 | 5/2012 | Nishikawa et al. |
| 2013/0037783 | A1 | 2/2013 | Lee et al. |
| 2013/0069046 | A1* | 3/2013 | Ishizuya ............... H10K 50/856 257/40 |
| 2013/0194477 | A1 | 8/2013 | Ito |
| 2014/0332781 | A1 | 11/2014 | Tokuda et al. |
| 2015/0001558 | A1 | 1/2015 | Nozawa et al. |
| 2015/0054716 | A1* | 2/2015 | Hirabayashi ............. H04N 5/77 345/8 |
| 2015/0069335 | A1 | 3/2015 | Hsu |
| 2017/0168452 | A1* | 6/2017 | Matsuo ............... G03H 1/2294 |
| 2017/0222186 | A1 | 8/2017 | Nozawa et al. |
| 2018/0323403 | A1 | 11/2018 | Nozawa et al. |
| 2019/0096971 | A1* | 3/2019 | Ukigaya ............... H10K 50/15 |
| 2019/0189955 | A1* | 6/2019 | Sakamoto ............. H10K 50/17 |
| 2019/0334115 | A1* | 10/2019 | Matsuda ............. H10K 59/873 |
| 2019/0393272 | A1* | 12/2019 | Kajimoto ............. H10K 50/86 |
| 2020/0180645 | A1* | 6/2020 | Itoh ..................... G06V 20/597 |
| 2020/0185651 | A1 | 6/2020 | Nozawa et al. |
| 2020/0259113 | A1* | 8/2020 | Takahashi ............. H10K 50/15 |
| 2020/0303683 | A1* | 9/2020 | Sano ..................... H10K 59/126 |
| 2020/0358032 | A1* | 11/2020 | Kajimoto ............. H10K 50/852 |
| 2021/0066411 | A1* | 3/2021 | Takahashi ............. H10K 50/856 |
| 2021/0111227 | A1* | 4/2021 | Tsuboi ............... H10K 59/1213 |
| 2021/0167333 | A1 | 6/2021 | Nozawa et al. |
| 2022/0115447 | A1* | 4/2022 | Ishizuya ............... H10K 59/879 |
| 2022/0328793 | A1 | 10/2022 | Nozawa et al. |
| 2024/0114716 | A1 | 4/2024 | Nozawa et al. |

FOREIGN PATENT DOCUMENTS

| | | |
|---|---|---|
| CN | 101582442 A | 11/2009 |
| CN | 103227188 A | 7/2013 |
| CN | 104282716 A | 1/2015 |
| CN | 107170762 A | 9/2017 |
| JP | 2008-210740 A | 9/2008 |
| JP | 2010-50014 A | 3/2010 |
| JP | 2010-244693 A | 10/2010 |
| JP | 2014-222592 A | 11/2014 |
| JP | 2015-1635 A | 1/2015 |
| JP | 2015-11913 A | 1/2015 |
| JP | 2015-197994 A | 11/2015 |
| JP | 2017-107887 A | 6/2017 |

OTHER PUBLICATIONS

Office Action dated Oct. 30, 2024, in counterpart application CN 202080075604.6 (19 pages).
Office Action dated Mar. 31, 2025, in counterpart application CN202080075604.6 (12 pages).

* cited by examiner

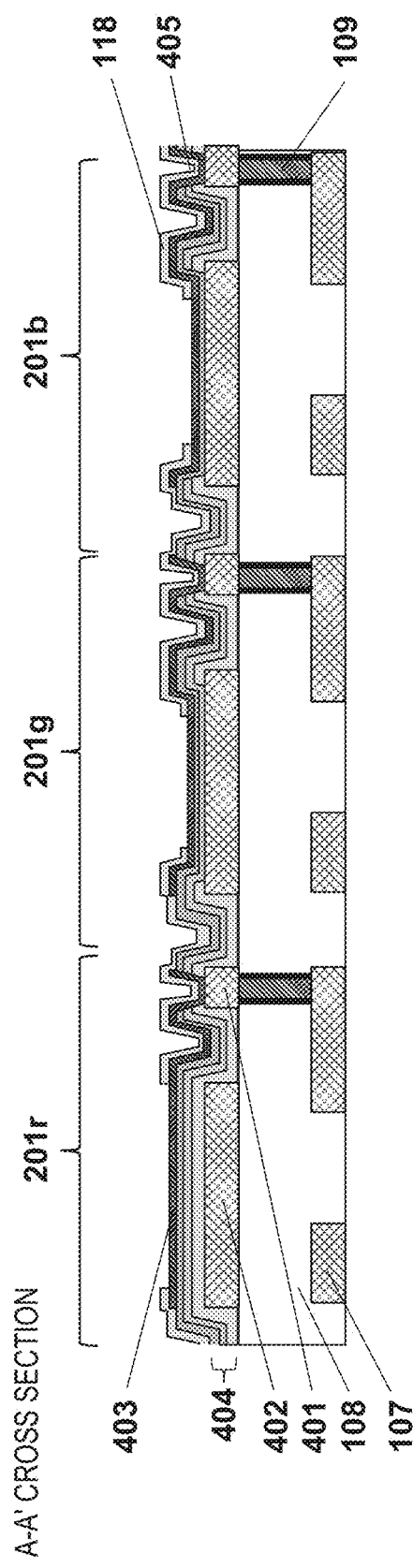

ORGANIC DEVICE, METHOD OF MANUFACTURING THE SAME, DISPLAY DEVICE, PHOTOELECTRIC CONVERSION DEVICE, ELECTRONIC APPARATUS, ILLUMINATION DEVICE, AND MOVING BODY

CROSS-REFERENCE TO RELATED APPLICATIONS

This application is a Continuation of International Patent Application No. PCT/JP2020/039132, filed Oct. 16, 2020, which claims the benefit of Japanese Patent Application No. 2019-195526 filed Oct. 28, 2019 and Japanese Patent Application No. 2020-163887 filed Sep. 29, 2020, both of which are hereby incorporated by reference herein in their entirety.

BACKGROUND OF THE INVENTION

Field of the Invention

The present invention relates to an organic device, a method of manufacturing the same, a display device, a photoelectric conversion device, an electronic apparatus, an illumination device, and a moving body.

Background Art

There is known an organic device including an organic function layer containing an organic compound, such as a light emitting device including an organic electroluminescence (to be referred to as organic EL hereinafter) film. Japanese Patent Laid-Open No. 2017-107887 describes an electrooptical device having an arrangement in which when light emitted from an organic EL element passes through a color filter, a desired emission color is obtained for each of B, G, and R pixels. In this electrooptical device, an optical resonance structure is constructed, for each of B, G, and R pixels, between a counter electrode and a power supply line functioning as a reflective layer, thereby obtaining light emission with enhanced luminance at a resonance wavelength corresponding to each of B, G, and R emission colors.

In the electrooptical device described in Japanese Patent Laid-Open No. 2017-107887, the end structure of a pixel is largely different between pixels of different colors. Therefore, in the electrooptical device described in Japanese Patent Laid-Open No. 2017-107887, a leakage current between adjacent pixels may be largely different depending on a combination of colors of the adjacent pixels. This is disadvantageous for, for example, suppressing degradation of image quality caused by color mixture.

SUMMARY OF THE INVENTION

The present invention provides a technique advantageous in suppressing degradation of image quality caused by a leakage current between pixels.

One of aspects of the present invention provides an organic device comprising a reflective film arranged on a substrate, a plurality of lower electrodes arranged above the reflective film, an organic function film configured to cover the plurality of lower electrodes, and an upper electrode arranged on the organic function film, wherein a potential difference between the upper electrode and the reflective film is lower than a threshold voltage at which the organic function film operates.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain principles of the invention.

FIG. 7A is a view schematically showing the sectional structure of the organic device according to the third embodiment;

DESCRIPTION OF THE EMBODIMENTS

Figure 1:
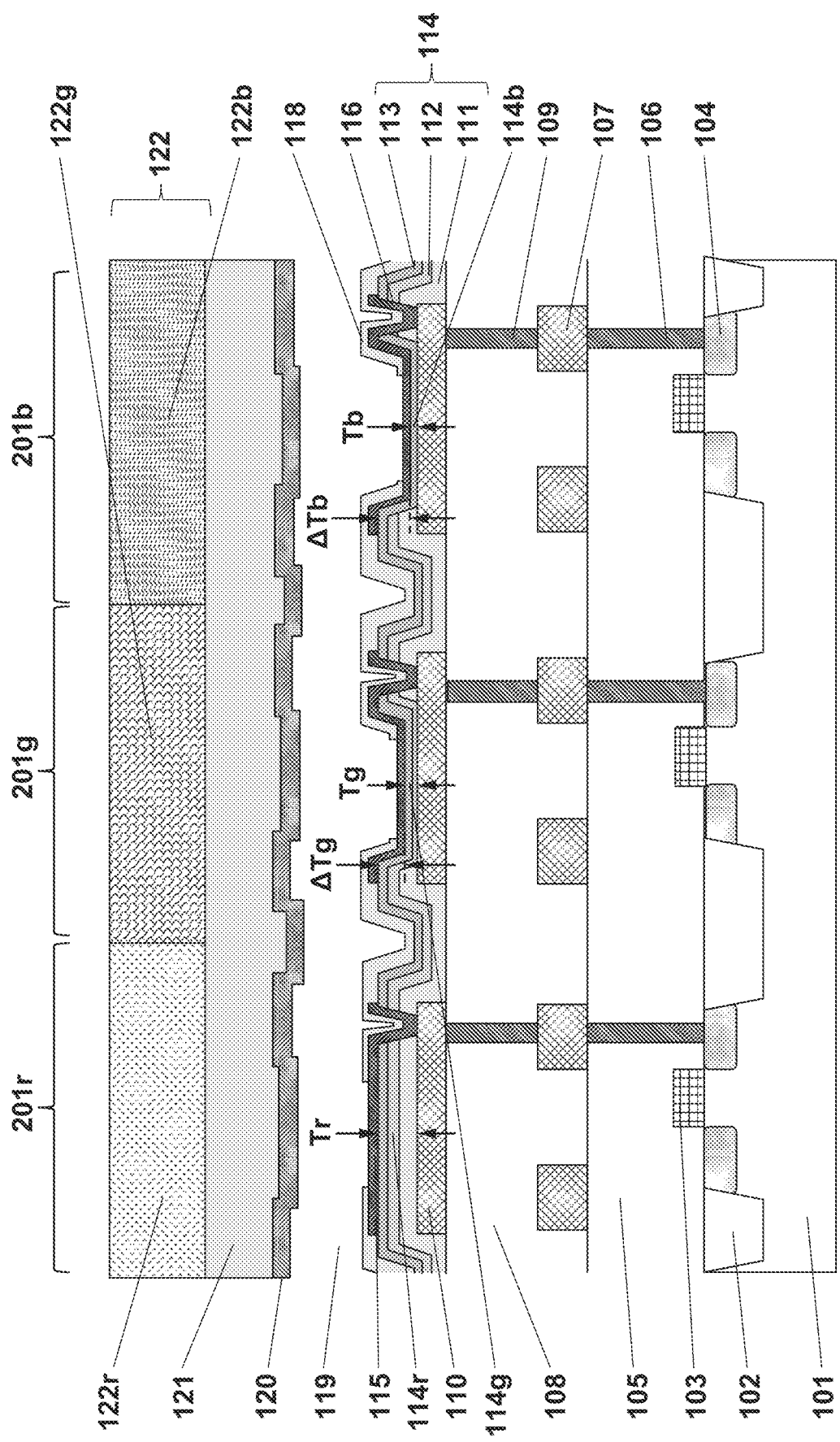
FIG. 1 is a schematic view showing the sectional structure of an organic device according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 2:
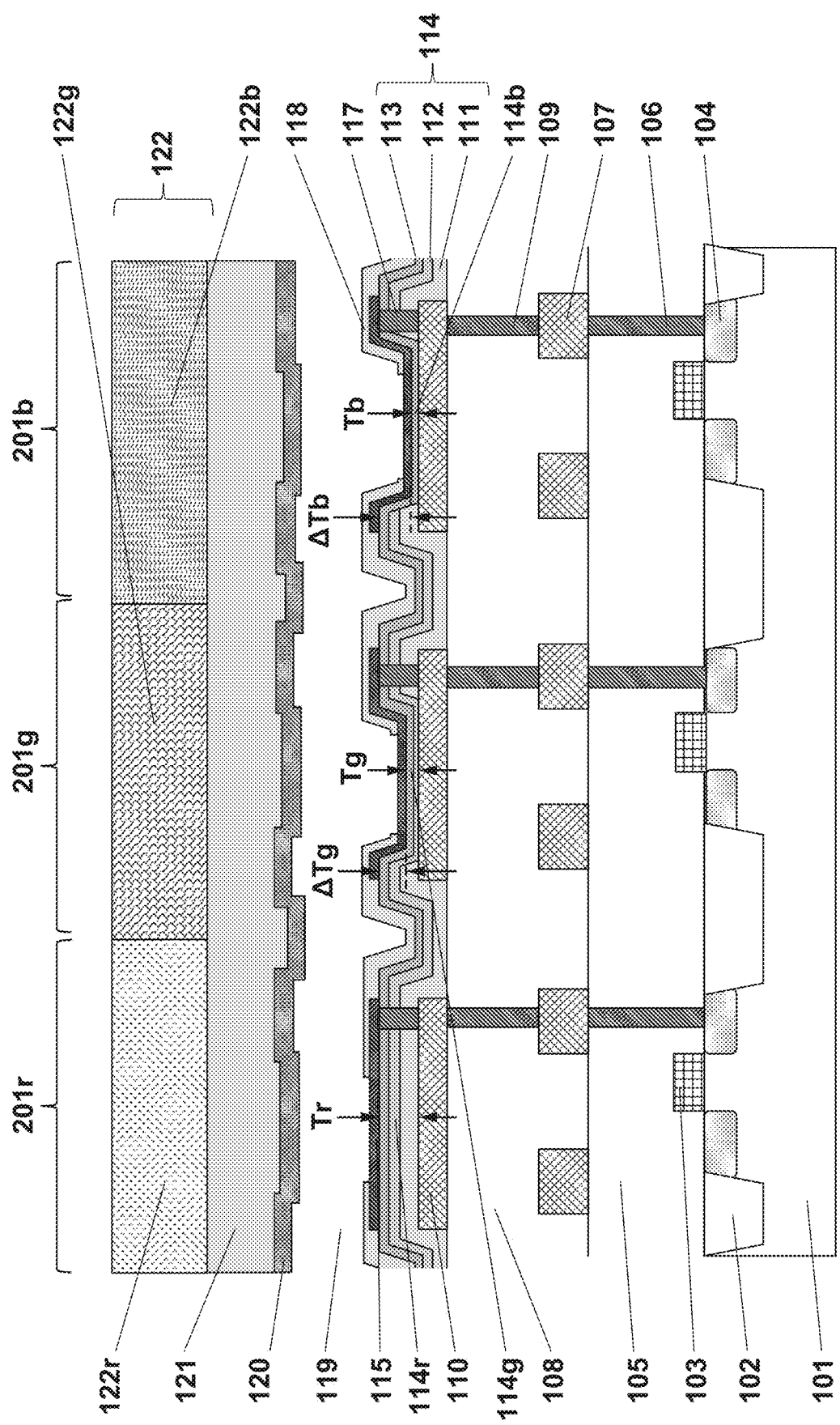
FIG. 2 is a schematic view showing the sectional structure of the organic device according to a modification of the first embodiment.
Figure 6:
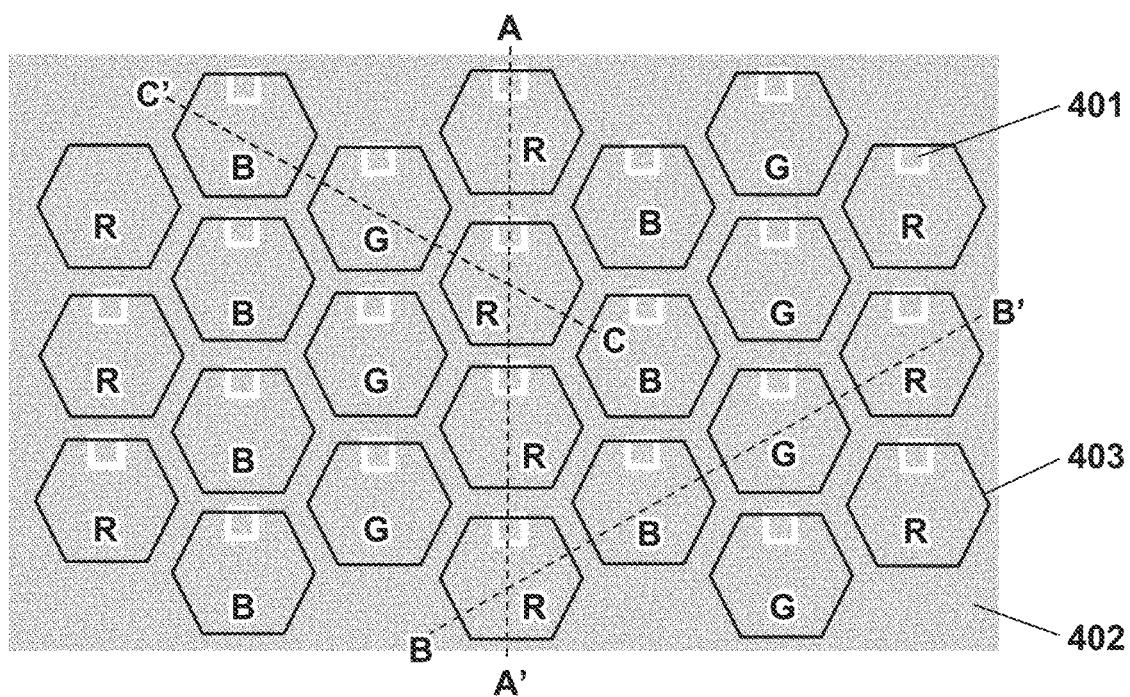
FIG. 6 is a view schematically showing a plan view of an organic device according to the third embodiment.

FIG. 1 schematically shows the sectional structure of an organic device 1 according to the first embodiment. FIG. 2 schematically shows the sectional structure of the organic device 1 according to a modification of the first embodiment. The organic device 1 includes a first pixel 201r, a second pixel 201g, and a third pixel 201b. The first pixel 201r, the second pixel 201g, and the third pixel 201b are pixels different from each other in terms of the structure of an optical adjustment film 114 (to be described later). The first pixel 201r, the second pixel 201g, and the third pixel 201b are pixels different from each other in terms of the color of light externally emitted from the organic device 1. The first pixel 201r emits light of red (R), the second pixel 201g emits light of green (G), and the third pixel 201b emits light of blue (B). The organic device 1 can include a plurality of first pixels 201r, a plurality of second pixels 201g, and a plurality of third pixels 201b. If the first pixels 201r, the second pixels 201g, and the third pixels 201b are arrayed, as schematically shown in FIG. 6, the sectional structure shown in FIG. 1 or 2 can correspond to the section taken along a line C-C' in FIG. 6. In FIG. 6, R, G, and B correspond to the first pixel 201r, the second pixel 201g, and the third pixel 201b, respectively.

The organic device 1 can include a substrate such as a semiconductor substrate 101. On the semiconductor substrate 101, an element isolation region 102 (for example, an STI) and a MOS transistor for driving a light emitting element (organic EL element) can be arranged. The MOS transistor can include a gate electrode 103 and a source/drain region 104. A first interlayer insulating film 105 can be arranged on the semiconductor substrate 101, and a first wiring layer 107 can be arranged on the first interlayer insulating film 105. The gate electrode 103 and the source/drain region 104 can electrically be connected to one of the first wiring patterns of the first wiring layer 107 via a first conductive plug 106. The first interlayer insulating film 105 can be, for example, a BPSG film formed by a thermal CVD method or an $SiO_2$ film formed by a plasma CVD method. The first wiring layer pattern of the first wiring layer 107 can be, for example, an AlCu film including a barrier metal such as Ti/TiN. The first conductive plug 106 can be, for example, a W plug including a barrier metal such as Ti/TiN.

A second interlayer insulating film 108 can be arranged on the first wiring layer 107, and a plurality of reflective portions 110 can be arranged on the second interlayer insulating film 108. The first wiring pattern of the first wiring layer 107 and the reflective portion 110 corresponding to it can electrically be connected via a second conductive plug 109. The second interlayer insulating film 108 can be, for example, $SiO_2$ formed by the plasma CVD method. The plurality of reflective portions 110 need only be made of a reflective material. The material of the plurality of reflective portions 110 is preferably a high-reflectance material such as Al, Ag, or Pt, or may be an alloy containing such material. Al or an alloy containing Al as a main component is particularly preferable since it is easy to increase the resolution. Furthermore, the reflective portion 110 may have a stacked structure, and can be an AlCu film including a barrier metal such as Ti/TiN between the film and the second interlayer insulating film 108. The second conductive plug 109 can be, for example, a W film including a barrier metal such as Ti/TiN. The plurality of reflective portions 110 can be arranged in the wiring layer.

An optical adjustment film 114 can be arranged to cover the plurality of reflective portions 110. The optical adjustment film 114 can include a first film 111, a second film 112 arranged (stacked) on the first film 111, and a third film 113 arranged (stacked) on the second film 112. The optical adjustment film 114 can include a portion formed by a stacked film of the first film 111, the second film 112, and the third film 113, a portion formed by a stacked film of the second film 112 and the third film 113, and a portion formed by a single-layer film of the third film 113. The optical adjustment film 114, or the first film 111, the second film 112, and the third film 113 are transparent insulating films, and can be formed by, for example, an $SiO_2$ film, an SiN film, an SiON film, or the like. In a region where both the first film 111 and the second film 112 exist, the second film 112 is arranged on the first film 111. In a region where all of the first film 111, the second film 112, and the third film 113 exist, the third film 113 is arranged on the second film 112, and the second film 112 is arranged on the first film 111.

In the first embodiment, the first pixel 201r includes an optical adjustment film 114r on the reflective portion 110 for the first pixel 201r, and the optical adjustment film 114r is formed by a stacked film of the first film 111, the second film 112, and the third film 113. The optical adjustment film 114r includes a portion formed by the stacked film of the first film 111, the second film 112, and the third film 113 in the peripheral portion of the reflective portion 110 for the first pixel 201r. Furthermore, the optical adjustment film 114r includes a portion formed by the stacked film of the first film 111, the second film 112, and the third film 113 in the central portion of the reflective portion 110 for the first pixel 201r. The thickness of the optical adjustment film 114r in the central portion of the reflective portion 110 for the first pixel 201r is represented by Tr. The optical adjustment film 114r of the first pixel 201r includes a step ΔTr on its surface (upper surface). In this example, the step ΔTr may be 0. That is, the step Tr is 0 or more. In the example shown in FIG. 1 or 2, the step ΔTr is 0 and is not shown. Note that the thickness of the optical adjustment film 114r located in the central portion of the reflective portion 110 and the thickness of the optical adjustment film 114r located in the peripheral portion of the reflective portion 110 are preferably substantially equal to each other. In this specification, the central portion of a given member (for example, the reflective portion or a lower electrode) indicates a portion within a range of D/3 from the barycenter of the member in a planar view (plan view) if D represents the distance from the barycenter to the end portion of the member. The peripheral portion of the member indicates a portion within a range of D/8 from the end portion of the member toward the barycenter of the member.

In the first embodiment, the second pixel 201g includes an optical adjustment film 114g. The optical adjustment film 114g includes a portion formed by the stacked film of the first film 111, the second film 112, and the third film 113 in the peripheral portion of the reflective portion 110 for the second pixel 201g. Furthermore, the optical adjustment film 114g includes a portion formed by the stacked film of the second film 112 and the third film 113 in the central portion of the reflective portion 110 for the second pixel 201g. The thickness of the optical adjustment film 114g in the central portion of the reflective portion 110 for the second pixel 201g is represented by Tg. The optical adjustment film 114g of the second pixel 201g includes a step ΔTg on its surface (upper surface) due to a difference in thickness between the peripheral portion and the central portion. In this example, the step ΔTg is larger than 0. Note that the film thickness of the optical adjustment film 114g located in the central portion of the reflective portion 110 is preferably smaller than the film thickness of the optical adjustment film 114g located in the peripheral portion of the reflective portion 110.

In the first embodiment, the third pixel 201b includes an optical adjustment film 114b. The optical adjustment film 114b includes a portion formed by the stacked film of the first film 111, the second film 112, and the third film 113 in the peripheral portion of the reflective portion 110 for the third pixel 201b. Furthermore, the optical adjustment film 114b includes a portion formed by the single-layer film of the third film 113 in the central portion of the reflective portion 110 for the third pixel 201b. The thickness of the optical adjustment film 114b in the central portion of the reflective portion 110 for the third pixel 201b is represented by Tb. The optical adjustment film 114b of the third pixel 201b includes a step ΔTb on its surface (upper surface) due to a difference in thickness between the peripheral portion and the central portion. In this example, the step ΔTb is larger than 0. Note that the film thickness of the optical adjustment film 114b located in the central portion of the reflective portion 110 is preferably smaller than the film thickness of the optical adjustment film 114b located in the peripheral portion of the reflective portion 110.

In this example, Tr>Tg and ΔTr<ΔTg are preferably satisfied. This means that the difference between the thickness of the optical adjustment film 114r in the peripheral portion of the reflective portion 110 for the first pixel 201r and the thickness of the optical adjustment film 114g in the peripheral portion of the reflective portion 110 for the second pixel 201g is decreased. This indicates that this arrangement can decrease the difference between the magnitude of the leakage current between the first pixel 201r and another pixel (the second pixel 201g or the third pixel 201b) and the magnitude of the leakage current between the second pixel 201g and another pixel (the first pixel 201r or the third pixel 201b). Therefore, this arrangement is advantageous in making the leakage current between the first pixel 201r and the other pixel and the leakage current between the second pixel 201g and the other pixel smaller than a predetermined value. As a result, this arrangement is advantageous in making the leakage current between the pixels smaller than the predetermined value. Furthermore, this arrangement is advantageous in making the leakage current between a lower electrode 115 and an upper electrode 120 uniform between the first pixel 201r and the second pixel 201g, and is effective for suppressing degradation of image quality caused by color mixture. The thickness of the optical adjustment film 114r in the peripheral portion of the reflective portion 110 for the first pixel 201r and the thickness of at least part of the optical adjustment film 114g in the peripheral portion of the reflective portion 110 for the second pixel 201g are particularly preferably substantially equal to each other.

Alternatively, Tg>Tb and ΔTg<ΔTb are preferably satisfied. This means that the difference between the thickness of the optical adjustment film 114g in the peripheral portion of the reflective portion 110 for the second pixel 201g and the thickness of the optical adjustment film 114b in the peripheral portion of the reflective portion 110 for the third pixel 201b is decreased. This indicates that this arrangement can decrease the difference between the magnitude of the leakage current between the second pixel 201g and another pixel (the first pixel 201r or the third pixel 201b) and the magnitude of the leakage current between the third pixel 201b and another pixel (the first pixel 201r or the second pixel 201g). Therefore, this arrangement is advantageous in making the leakage current between the second pixel 201g and the other pixel and the leakage current between the third pixel 201b and the other pixel smaller than the predetermined value. As a result, this arrangement is advantageous in making the leakage current between the pixels smaller than the predetermined value. Furthermore, this arrangement is advantageous in making the leakage current between the lower electrode 115 and the upper electrode 120 uniform between the second pixel 201g and the third pixel 201b, and is effective for suppressing degradation of image quality caused by color mixture. The thickness of the optical adjustment film 114g in the peripheral portion of the reflective portion 110 for the second pixel 201g and the thickness of at least part of the optical adjustment film 114b in the peripheral portion of the reflective portion 110 for the second pixel 201b are particularly preferably substantially equal to each other.

In addition, Tr>Tg>Tb and ΔTr<ΔTg<ΔTb are preferably satisfied. This means that the differences in thickness between the optical adjustment films 114r, 114g, and 114b in the peripheral portions of the reflective portions 110 for the first pixel 201r, the second pixel 201g, and the third pixel 201b are decreased. This indicates that this arrangement can decrease the differences in the magnitude of the leakage current between the first pixel 201r, the second pixel 201g, and the third pixel 201b. Therefore, this arrangement is advantageous in making the leakage current between the pixels smaller than the predetermined value. Furthermore, this arrangement is advantageous in making the leakage current between the lower electrode 115 and the upper electrode 120 uniform among the first pixel 201r, the second pixel 201g, and the third pixel 201b, and is effective for suppressing degradation of image quality caused by color mixture. The thicknesses of at least parts of the optical adjustment films 114r, 114g, and 114b in the peripheral portions of the reflective portions 110 for the first pixel 201r, the second pixel 201g, and the third pixel 201b are particularly preferably substantially equal to each other. Furthermore, the thicknesses of the optical adjustment films 114r, 114g, and 114b in the peripheral portions of the reflective portions 110 for the first pixel 201r, the second pixel 201g, and the third pixel 201b and the thickness of at least part of the optical adjustment film 114r located in the central portion of the reflective portion 110 for the first pixel 201r are preferably substantially equal to each other.

The plurality of lower electrodes 115 can be arranged on the optical adjustment film 114 (114r, 114g, and 114b). The plurality of lower electrodes 115 can be made of a transparent material, for example, indium tin oxide (ITO) or indium zinc oxide (IZO). In the first embodiment shown in FIG. 1, each lower electrode 115 extends to an opening 116 (contact hole) formed in the optical adjustment film 114, and is electrically connected, in the opening 116, to the peripheral portion of the reflective portion 110 arranged under the lower electrode 115. In the modification shown in FIG. 2, each lower electrode 115 is electrically connected, by a plug 117 passing through the optical adjustment film 114, to the peripheral portion of the reflective portion 110 arranged under the lower electrode 115. The plug 117 can be, for example, a W plug including a barrier metal such as Ti/TiN.

The organic device 1 can further include an insulating film 118 that covers the peripheral portion of each of the plurality of lower electrodes 115 and the optical adjustment film 114 between the plurality of lower electrodes 115. Each lower electrode 115 may include a central portion and a peripheral portion surrounding the central portion, the central portion and the peripheral portion may have different thicknesses, and the thickness of the central portion may be smaller than that of the peripheral portion. The peripheral portion of the lower electrode 115 may be a region covered with the insulating film 118. Each lower electrode 115 may have a step along the optical adjustment film 114. The step of the optical adjustment film 114 may include a portion inclined with respect to the substrate. The insulating film 118 can be, for example, an $SiO_2$ film formed by the plasma CVD method. The insulating film 118 is arranged to electrically insulate the plurality of lower electrodes 115 from each other.

An organic function film 119 can be arranged on the insulating film 118. The organic function film 119 includes at least an organic light emitting material layer, and may further include, for example, a charge transport layer and a charge blocking layer. The organic function film 119 may be arranged continuously in the first pixel 201r and the second pixel 202g. The term "an organic function film is arranged continuously" can indicate that organic function films are connected, an organic function film is arranged over pixels, or the first pixel and the second pixel share one organic function film. The organic function film 119 may also be arranged continuously in the third pixel 203b in addition to the first pixel and the second pixel. An upper electrode 120 can be arranged on the organic function film 119. The upper electrode 120 can be made of a transparent material so as to transmit light generated by the organic function film 119 without blocking. The upper electrode 120 can be formed by, for example, a thin film of gold, platinum, silver, aluminum, chromium, magnesium, or an alloy thereof. A sealing film 121 can be arranged on the upper electrode 120. The sealing film 121 is a film for preventing permeation of water into the semiconductor substrate 101, the organic function film 119, and the upper electrode 120, and is formed by, for example, an SiN film formed by the plasma CVD method. A color filter layer 122 can be arranged on the sealing film 121. The color filter layer 122 can include a color filter 122r for the first pixel 201r, a color filter 122g for the second pixel 201g, and a color filter 123b for the third pixel 201b. A microlens (not shown) may be provided above or below the color filter layer 122. The microlens may aim at improving the light emission efficiency.

The MOS transistor formed on the semiconductor substrate 101 sends an electrical signal to each lower electrode 115, and the organic function film 119 generates light. The light emitted from the organic function film 119 to the semiconductor substrate 101 is reflected by the reflective portion 110. The light emitted from the organic function film 119 to the upper electrode 120 and the light reflected by the reflective portion 110 are amplified by resonating at a wavelength corresponding to the thickness Tr, Tg, or Tb of the optical adjustment film 114 in the central portion of the reflective portion 110 for each of the pixels 201r, 201g, and 201b. The thus amplified light exits through the color filter 122r, 122g, or 122b.

The thicknesses Tr, Tg, and Tb of the optical adjustment films 114 in the central portions of the reflective portions 110 for the pixels 201r, 201g, and 201b are decided in consideration of the amplification effect of light. On the other hand, the steps ΔTr, ΔTg, and ΔTb can be decided so that the leakage current between the pixels is smaller than the predetermined value. The steps ΔTr, ΔTg, and ΔTb can be decided so that, for example, the thicknesses of the optical adjustment films 114 in the peripheral portions of the reflective portions 110 for the pixels 201r, 201g, and 201b are equal to each other.

It is desirable that Tr, Tg, and Tb can be replaced by T1, T2, and T3, ΔTr, ΔTg, and ΔTb can be replaced by ΔT1, ΔT2, and ΔT3, and T1>T2>T3 and ΔT1<ΔT2<ΔT3 are satisfied. Alternatively, it is desirable that Tr and Tg can be replaced by T1 and T2, ΔTr and ΔTg can be replaced by ΔT1 and ΔT2, and T1>T2 and ΔT1<ΔT2 are satisfied. Alternatively, it is desirable that Tg and Tb can be replaced by T1 and T2, ΔTg and ΔTb can be replaced by ΔT1 and ΔT2, and T1>T2 and ΔT1<ΔT2 are satisfied. This embodiment has explained a case in which the thicknesses Tr, Tg, and Tb of the optical adjustment films 114 in the central portions of the reflective portions 110 for the red, green, and blue light emitting pixels have a relationship of Tr>Tg>Tb, and the steps ΔTr, ΔTg, and ΔTb have a relationship of ΔTr<ΔTg<ΔTb. However, the magnitude relationship depending on the emission colors is not limited to this. For example, the following relationships are possible.

| | |
|---|---|
| Tr>Tb>Tg, ΔTr<ΔTb<ΔTg | Relationship A: |
| Tg>Tr>Tb, ΔTg<ΔTr<ΔTb | Relationship B: |
| Tg>Tb>Tr, ΔTg<ΔTb<ΔTr | Relationship C: |
| Tb>Tr>Tg, ΔTb<ΔTr<ΔTg | Relationship D: |
| Tb>Tg>Tr, ΔTb<ΔTg<ΔTr | Relationship E: |

A method of manufacturing the organic device 1 according to the first embodiment will be described below with reference to FIGS. 3A to 3H. Note that a description of steps up to formation of the conductive plugs 109 will be omitted. In a step shown in FIG. 3A, for example, an AlCu film (for example, an Al film added with Cu of 0.5 (atm %)) is formed by the sputtering method on the second interlayer insulating film 108 in which the conductive plugs 109 are formed. After that, the AlCu film can be patterned by a photolithography step and a dry etching step, thereby forming the plurality of reflective portions 110. Next, in a step shown in FIG. 3B, for example, a first film 111a formed from an SiO$_2$ film is formed by the plasma CVD method. After that, in a step shown in FIG. 3C, for example, a portion, of the first film 111a, located on the central portion of the reflective portion 110 of the second pixel 201g is removed by the photolithography step and the dry etching step, thereby forming a first film 111b. Next, in a step shown in FIG. 3D, for example, a second film 112a formed from an SiO$_2$ film is formed by the plasma CVD method. Next, in a step shown in FIG. 3E, portions, of the first film 11b and the second film 112a, located on the central portion of the reflective portion 110 of the third pixel 201b are opened by the photolithography step and the dry etching step. This forms the first film 111 and the second film 112.

Figure 3A:
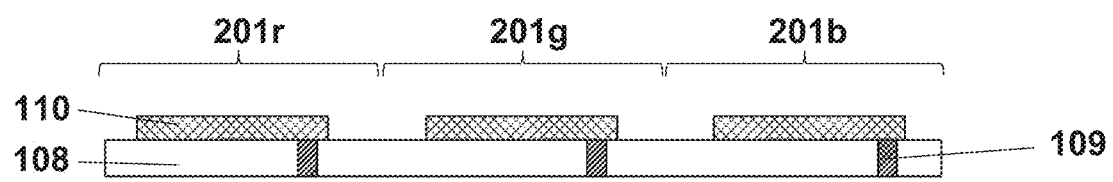
FIG. 3A is a view showing a method of manufacturing the organic device according to the first embodiment.
Figure 3B:
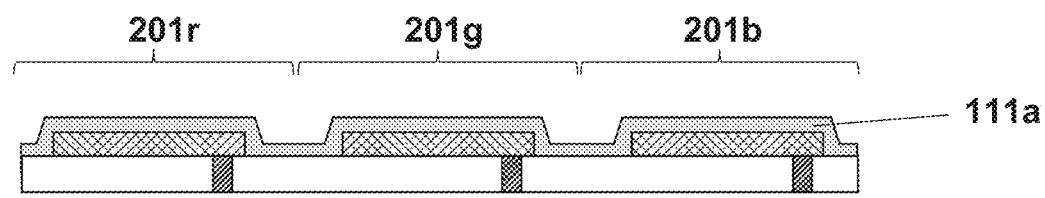
FIG. 3B is a view showing the method of manufacturing the organic device according to the first embodiment.
Figure 3C:
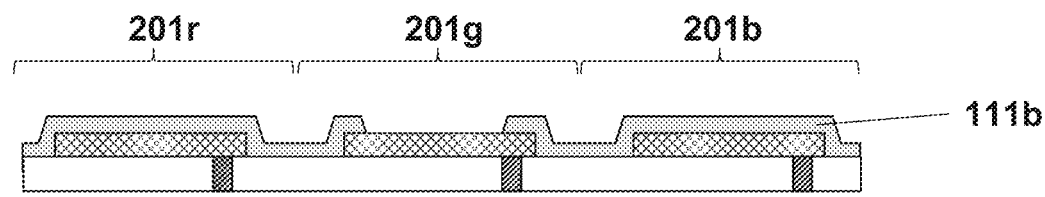
FIG. 3C is a view showing the method of manufacturing the organic device according to the first embodiment.
Figure 3D:
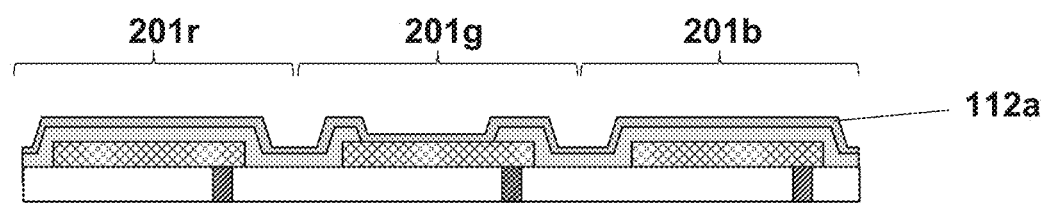
FIG. 3D is a view showing the method of manufacturing the organic device according to the first embodiment.
Figure 3E:
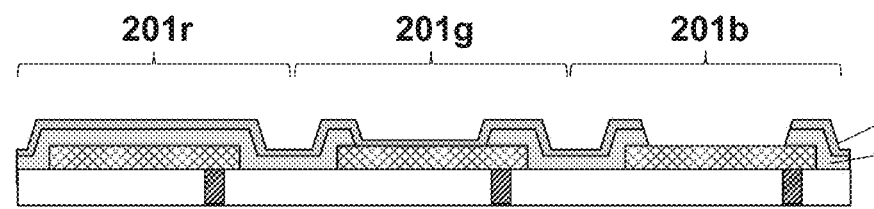
FIG. 3E is a view showing the method of manufacturing the organic device according to the first embodiment.
Figure 3F:
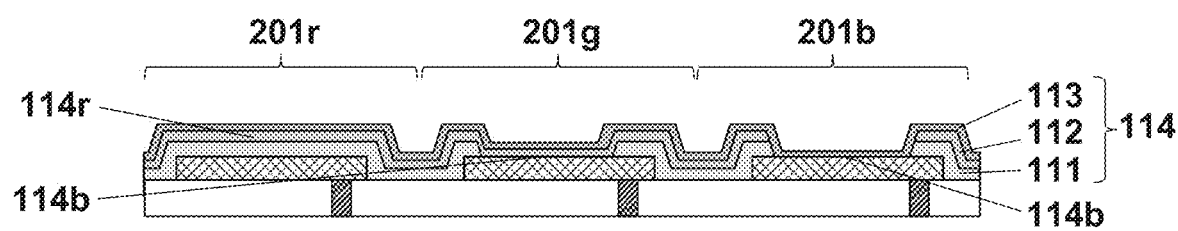
FIG. 3F is a view showing the method of manufacturing the organic device according to the first embodiment.

Next, in a step shown in FIG. 3F, for example, the third film 113 formed from an SiO$_2$ film is formed by the plasma CVD method, thereby forming the optical adjustment film 114 formed from the first film 111, the second film 112, and the third film 113. The optical adjustment film 114 includes the first optical adjustment film 114r for the first pixel 201r, the second optical adjustment film 114g for the second pixel 201g, and the third optical adjustment film 114b for the third pixel 201b. The first optical adjustment film 114r has the thickness Tr and the step ΔTr, the second optical adjustment film 114g has the thickness Tg and the step ΔTg, and the third optical adjustment film 114b has the thickness Tb and the step ΔTb. The method shown in FIGS. 3A to 3H can readily, accurately control the thicknesses of the optical adjustment films 114r, 114g, and 114b in the central portions of the reflective portions 110 for the first pixel 201r, the second pixel 201g, and the third pixel 201b. In this example, since the thickness of the optical adjustment film 114 can be controlled accurately, the optical characteristics such as the light emission efficiency and chromaticity of light emitting pixels can be controlled accurately. Unlike this method, there is also provided a method of controlling the thicknesses of the optical adjustment films 114r, 114g, and 114b in the central portions of the reflective portions 110 for the first pixel 201r, the second pixel 201g, and the third pixel 201b by the etching time. However, in the method of controlling the thicknesses by the etching time, it is difficult to accurately control the thicknesses.

Figure 3G:
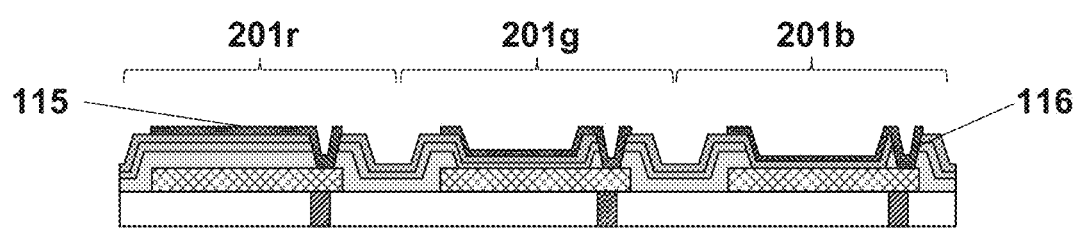
FIG. 3G is a view showing the method of manufacturing the organic device according to the first embodiment.

In a step shown in FIG. 3G, the openings 116 (contact holes) are formed in the optical adjustment film 114 by the photolithography step and the dry etching step. After that, for example, an electrode film such as an ITO film or IZO film is formed by the sputtering method, and patterned by the photolithography step and the dry etching step, thereby forming the plurality of lower electrodes 115. In this manufacturing method, the edge of the photoresist pattern for forming the openings 116 and the lower electrodes 115 can be arranged in a region (the peripheral portion of the pixel) where the height difference is small between the pixels 201r, 201g, and 201b. Therefore, it is possible to reduce the process errors of the openings 116 and the lower electrodes 115 between the pixels 201r, 201g, and 201b. At least part of the end portion of each lower electrode 115 is particularly preferably arranged to be superimposed on the peripheral portion of the reflective portion 110 of each pixel in a planar view.

Figure 3H:
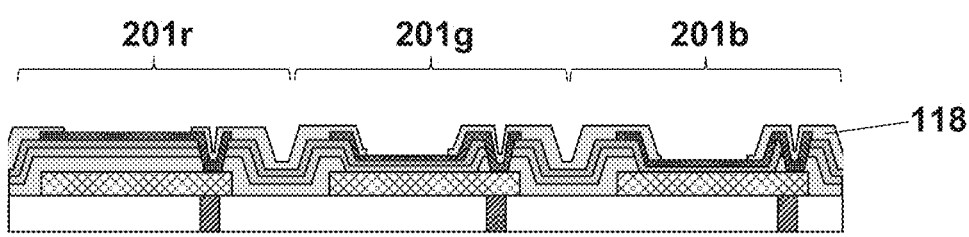
FIG. 3H is a view showing the method of manufacturing the organic device according to the first embodiment.

Next, in a step shown in FIG. 3H, for example, an SiO$_2$ film is formed by the plasma CVD method so as to cover the peripheral portion of each of the plurality of lower electrodes 115 and the optical adjustment film 114 between the plurality of lower electrodes 115. After that, the SiO$_2$ film is patterned by the photolithography step and the dry etching step, thereby forming the insulating film 118. With respect to the insulating film 118 as well, the process errors between the pixels 201r, 201g, and 201b can be reduced.

Although not shown, for example, the organic function film 119 and the upper electrode 120 are sequentially formed using a deposition mask by a vacuum deposition method, and then, for example, the sealing film 121 is formed by the CVD method. After that, the color filter layer 122 can be formed by a photolithography method. Furthermore, a microlens may be formed above or below the color filter layer to improve the light emission efficiency.

Figure 4:
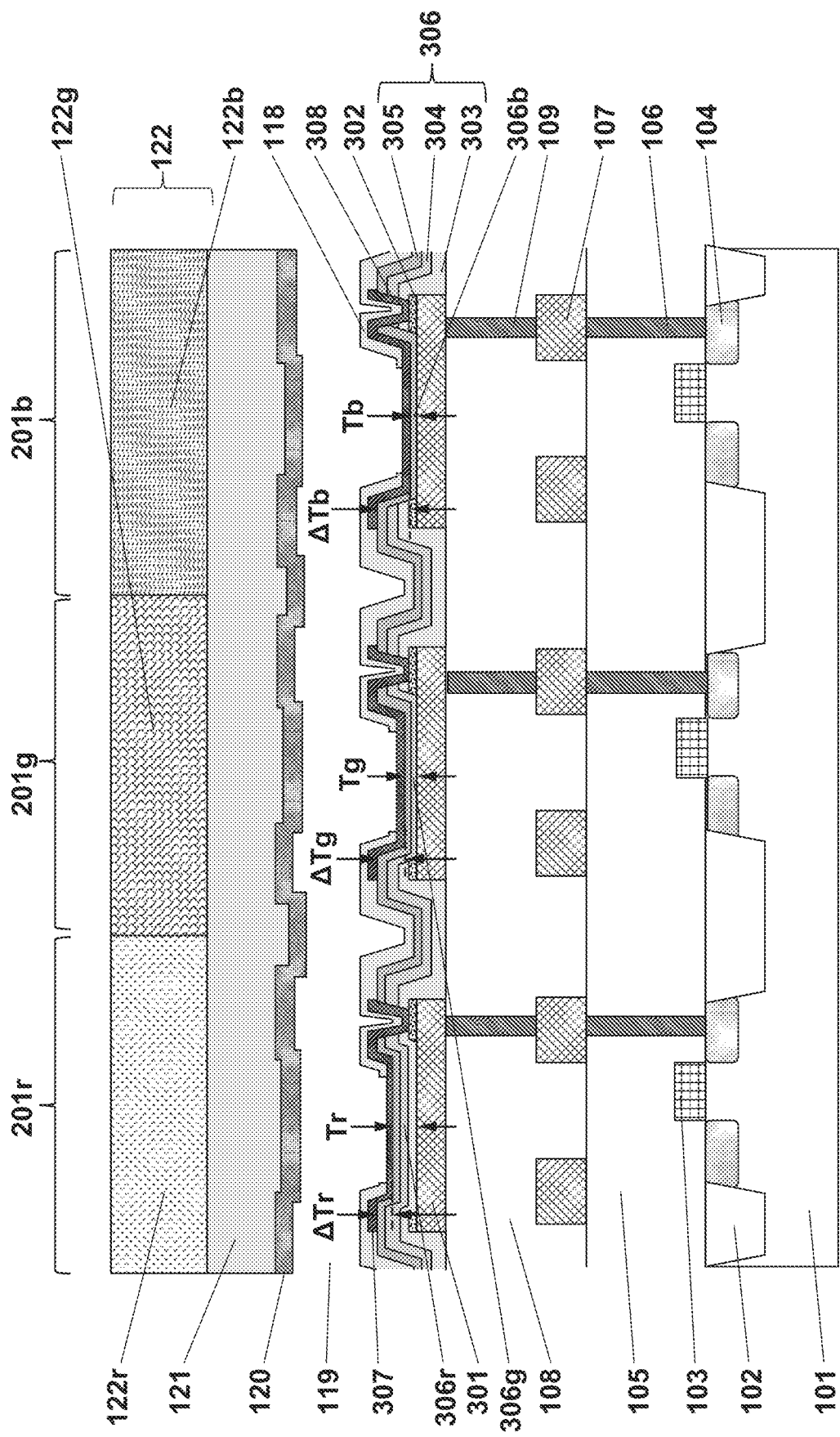
FIG. 4 is a schematic view showing the sectional structure of an organic device according to the second embodiment.

FIG. 4 schematically shows the sectional structure of an organic device 1 according to the second embodiment. Matters that are not mentioned as the second embodiment can comply with the first embodiment. In the second embodiment, a plurality of reflective portions 301 are arranged on a second interlayer insulating film 108, instead of the plurality of reflective portions 110 in the first embodiment. An antireflection electrode 302 is arranged on each reflective portion 301 to contact it. Each reflective portion 301 and each antireflection electrode 302 are electrically connected to each other. Each reflective portion 301 can be formed by, for example, an AlCu film including a barrier metal such as Ti/TiN. Each antireflection electrode 302 may be formed by a layer including at least one of TiN, Ti, W, Co, Ta, and TaN, and can also have a stacked structure thereof. The film thickness of the antireflection electrode 302 is preferably about 1 to 200 nm. Each antireflection electrode can be formed by, for example, a known technique such as a sputtering method or a deposition method.

An optical adjustment film 306 can be arranged to cover the plurality of reflective portions 301 and the plurality of antireflection electrodes 302. The optical adjustment film 306 can include a portion formed by a stacked film of a first film 303, a second film 304, and a third film 305, a portion formed by a stacked film of the second film 304 and the third film 305, and a portion formed by a single-layer film of the third film 305. The optical adjustment film 306, or the first film 303, the second film 304, and the third film 305 can be formed by, for example, a SiO$_2$ film. Optical adjustment films 306r, 306g, and 306b of different film thicknesses are formed by forming openings in parts of an interlayer insulating film material and an antireflection electrode material on the reflective portions 301 of a first pixel 201r, a second pixel 201g, and a third pixel 201b. If Tr, Tg, and Tb represent the film thicknesses and ΔTr, ΔTg, and ΔTb represent step film thicknesses formed by the openings, the film thicknesses and the steps have film thickness relationships of Tr>Tg>Tb and ΔTr<ΔTg<ΔTr, respectively. A member forming each antireflection electrode 302 preferably exists in at least part of the peripheral portion of the reflective portion 301, and is more preferably formed to surround the reflective portion 301. The thickness of each reflective portion may be different between the central portion and the peripheral portion and the thickness of the central portion may be smaller than that of the peripheral portion.

Lower electrodes 307 are arranged on the optical adjustment film 306. Each lower electrode 307 is desirably made of a transparent material, and is formed using indium tin oxide (ITO) or indium zinc oxide (IZO). Openings 308 are formed in the optical adjustment film 306, and each antireflection electrode 302 and each lower electrode 307 are electrically connected in the opening 308. If each reflective portion 301 is made of AlCu and each lower electrode 307 is made of a material containing oxygen, when each reflective portion 301 and each lower electrode 307 directly contact each other, aluminum oxide is formed, which may cause a conductive failure. To cope with this, by electrically connecting each reflective portion 301 and each lower electrode 307 via the antireflection electrode 302 made of TiN or the like that is difficult to react with oxygen, it is possible to prevent occurrence of a conductive failure. Similar to the first embodiment, an insulating film 118, an organic function film 119, an upper electrode 120, a sealing film 121, and a color filter 122 can be arranged on the lower electrodes 307.

In the second embodiment, the first pixel 201r includes the optical adjustment film 306r on the reflective portion 301, and the optical adjustment film 306r can be formed by a stacked film of the first film 303, the second film 304, and the third film 305. The optical adjustment film 306r includes a portion formed by the stacked film of the first film 303, the second film 304, and the third film 305 in the peripheral portion of the reflective portion 301 for the first pixel 201r. The optical adjustment film 306r includes a portion formed by the stacked film of the first film 303, the second film 304, and the third film 305 in the central portion of the reflective portion 301 for the first pixel 201r. The thickness of the optical adjustment film 306r in the central portion of the reflective portion 301 for the first pixel 201r is represented by Tr. The optical adjustment film 306r of the first pixel 201r includes a step ΔTr on its surface (upper surface). In this example, the step ΔTr is larger than 0. Furthermore, the step between the upper surface of the central portion of the reflective portion 301 of the first pixel 201r and the upper surface of the antireflection electrode 302 is preferably substantially equal to the step ΔTr.

In the second embodiment, the second pixel 201g includes the optical adjustment film 306g. The optical adjustment film 306g includes a portion formed by the stacked film of the first film 303, the second film 304, and the third film 305 in the peripheral portion of the reflective portion 301 for the second pixel 201g. The optical adjustment film 306g includes a portion formed by the stacked film of the second film 112 and the third film 113 in the central portion of the reflective portion 301 for the second pixel 201g. The thickness of the optical adjustment film 306g in the central portion of the reflective portion 301 for the second pixel 201g is represented by Tg. The optical adjustment film 306g of the second pixel 201g includes a step ΔTg on its surface (upper surface) due to a difference in thickness between the peripheral portion and the central portion and the thickness of the antireflection electrode. In this example, the step ΔTg is larger than 0.

In the second embodiment, the third pixel 201b includes the optical adjustment film 306b. The optical adjustment film 306b includes a portion formed by the stacked film of the first film 303, the second film 304, and the third film 305 in the peripheral portion of the reflective portion 301 for the third pixel 201b. The optical adjustment film 306b includes a portion formed by the single-layer film of the third film 305 in the central portion of the reflective portion 301 for the third pixel 201b. The thickness of the optical adjustment film 306b in the central portion of the reflective portion 301 for the third pixel 201b is represented by Tb. The optical adjustment film 306b of the third pixel 201b includes a step ΔTb on its surface (upper surface) due to a difference in thickness between the peripheral portion and the central portion and the thickness of the antireflection electrode. In this example, the step ΔTb is larger than 0.

In this example, Tr>Tg and ΔTr<ΔTg are preferably satisfied. This means that the difference between the thickness of the optical adjustment film 306r in the peripheral portion of the reflective portion 301 for the first pixel 201r and the thickness of the optical adjustment film 306g in the peripheral portion of the reflective portion 301 for the second pixel 201g is decreased. This indicates that this arrangement can decrease the difference between the magnitude of the leakage current between the first pixel 201r and another pixel (the second pixel 201g or the third pixel 201b) and the magnitude of the leakage current between the second pixel 201g and another pixel (the first pixel 201r or the third pixel 201b). Therefore, this arrangement is advantageous in making the leakage current between the first pixel 201r and the other pixel and the leakage current between the second pixel 201g and the other pixel smaller than a predetermined value. As a result, this arrangement is advantageous in making the leakage current between the pixels smaller than the predetermined value. Furthermore, this arrangement is advantageous in making the leakage current between the lower electrode 307 and the upper electrode 120 uniform between the first pixel 201r and the second pixel 201g, and is effective for suppressing degradation of image quality caused by color mixture. The thickness of the optical adjustment film 306r in the peripheral portion of the reflective portion 301 for the first pixel 201r and the thickness of at least part of the optical adjustment film 306g in the peripheral portion of the reflective portion 301 for the second pixel 201g are particularly preferably substantially equal to each other.

Alternatively, Tg>Tb and ΔTg<ΔTb are preferably satisfied. This means that the difference between the thickness of the optical adjustment film 306g in the peripheral portion of the reflective portion 301 for the second pixel 201g and the thickness of the optical adjustment film 306b in the peripheral portion of the reflective portion 301 for the third pixel 201b is decreased. This indicates that this arrangement can decrease the difference between the magnitude of the leakage current between the second pixel 201g and another pixel (the first pixel 201r or the third pixel 201b) and the magnitude of the leakage current between the third pixel 201b and another pixel (the first pixel 201r or the second pixel 201g). Therefore, this arrangement is advantageous in making the leakage current between the second pixel 201g and the other pixel and the leakage current between the third pixel 201b and the other pixel smaller than the predetermined value. As a result, this arrangement is advantageous in making the leakage current between the pixels smaller than the predetermined value. Furthermore, this arrangement is advantageous in making the leakage current between the lower electrode 307 and the upper electrode 120 uniform between the second pixel 201g and the third pixel 201b, and is effective for suppressing degradation of image quality caused by color mixture. The thickness of the optical adjustment film 306g in the peripheral portion of the reflective portion 301 for the first pixel 201g and the thickness of at least part of the optical adjustment film 306b in the peripheral portion of the reflective portion 301 for the second pixel 201b are particularly preferably substantially equal to each other.

In addition, Tr>Tg>Tb and ΔTr<ΔTg<ΔTb are preferably satisfied. This means that the differences in thickness between the optical adjustment films 306r, 306g, and 306b in the peripheral portions of the reflective portions 110 for the first pixel 201r, the second pixel 201g, and the third pixel 201b are decreased. This indicates that this arrangement can decrease the differences in the magnitude of the leakage current between the first pixel 201r, the second pixel 201g, and the third pixel 201b. Therefore, this arrangement is advantageous in making the leakage currents between the pixels smaller than the predetermined value. Furthermore, this arrangement is advantageous in making the leakage current between the lower electrode 307 and the upper electrode 120 uniform among the first pixel 201r, the second pixel 201g, and the third pixel 201b, and is effective for suppressing degradation of image quality caused by color mixture. The thicknesses of at least parts of the optical adjustment films 306r, 306g, and 306b in the peripheral portions of the reflective portions 301 for the first pixel 201r, the second pixel 201g, and the third pixel 201b are particularly preferably substantially equal to each other. Furthermore, the thicknesses of the optical adjustment films 114r, 114g, and 114b in the peripheral portions of the reflective portions 110 for the first pixel 201r, the second pixel 201g, and the third pixel 201b, and the thickness of at least part of the optical adjustment film 114r located in the central portion of the reflective portion 110 for the first pixel 201r are preferably substantially equal to each other.

This embodiment has explained a case in which the thicknesses Tr, Tg, and Tb of the optical adjustment films 306 in the central portions of the reflective portions 301 for the red, green, and blue light emitting pixels have a relationship of Tr>Tg>Tb, and the steps ΔTr, ΔTg, and ΔTb have a relationship of ΔTr<ΔTg<ΔTb. However, the magnitude relationship depending on the emission colors is not limited to this. For example, the following relationships are possible.

| | |
|---|---|
| Tr>Tb>Tg, ΔTr<ΔTb<ΔTg | Relationship A: |
| Tg>Tr>Tb, ΔTg<ΔTr<ΔTb | Relationship B: |
| Tg>Tb>Tr, ΔTg<ΔTb<ΔTr | Relationship C: |
| Tb>Tr>Tg, ΔTb<ΔTr<ΔTg | Relationship D: |
| Tb>Tg>Tr, ΔTb<ΔTg<ΔTr | Relationship E: |

A method of manufacturing the organic device 1 according to the second embodiment will be described below with reference to FIGS. 5A to 5I. Note that a description of steps up to formation of the conductive plugs 109 will be omitted. In a step shown in FIG. 5A, for example, an AlCu film (for example, an Al film added with Cu of 0.5 (atm %)) and a TiN film (antireflection film) are formed by the sputtering method on the second interlayer insulating film 108 in which the conductive plugs 109 are formed. Then, a stacked film of the AlCu film and the TiN film can be patterned by a photolithography step and a dry etching step, thereby forming a plurality of stacked bodies each formed by a stacked film of the reflective portion 301 and an antireflection electrode 302a. At this time, in an exposure step in the photolithography step, the fine reflective portion 301 can be formed when the antireflection electrode 302a suppresses a reflected wave from the AlCu film.

Figure 5A:
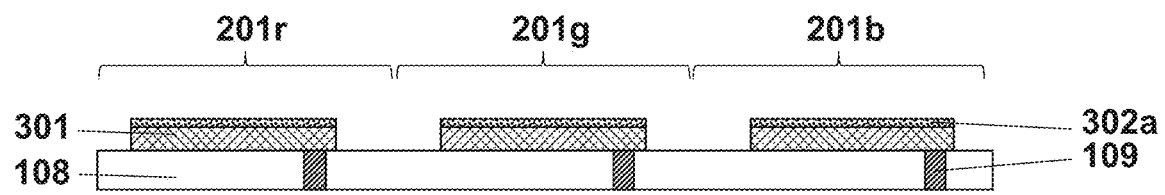
FIG. 5A is a view showing a method of manufacturing the organic device according to the second embodiment.
Figure 5B:
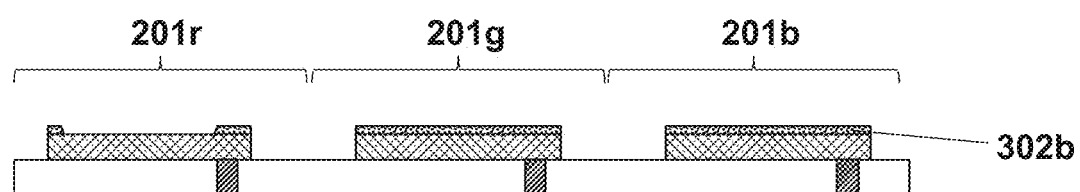
FIG. 5B is a view showing the method of manufacturing the organic device according to the second embodiment.
Figure 5C:
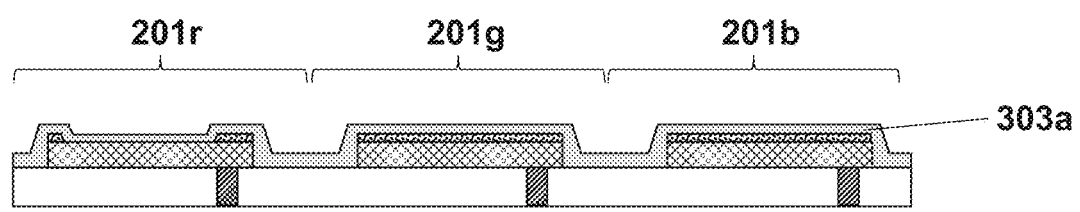
FIG. 5C is a view showing the method of manufacturing the organic device according to the second embodiment.
Figure 5D:
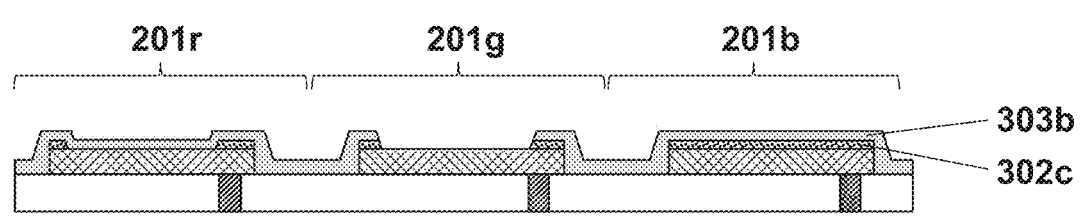
FIG. 5D is a view showing the method of manufacturing the organic device according to the second embodiment.

Next, in a step shown in FIG. 5B, a plurality of antireflection electrodes 302b are formed by removing the antireflection electrode 302a in the central portion of the reflective portion 301 of each first pixel 201r by the photolithography step and the dry etching step. Next, in a step shown in FIG. 5C, for example, a first film 303a formed from an SiO₂ film is formed by the plasma CVD method. Next, in a step shown in FIG. 5D, portions, of the first film 303a and the antireflection electrode 302a, located on the central portion of the reflective portion 301 of the second pixel 201g are removed by the photolithography step and the dry etching step. This forms an antireflection electrode 302c and a first film 303b.

Figure 5E:
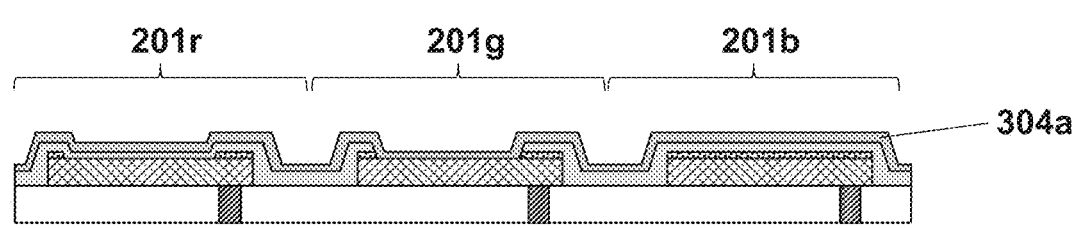
FIG. 5E is a view showing the method of manufacturing the organic device according to the second embodiment.
Figure 5F:
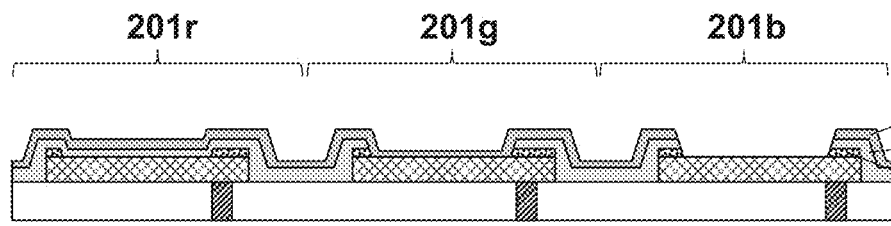
FIG. 5F is a view showing the method of manufacturing the organic device according to the second embodiment.
Figure 5G:
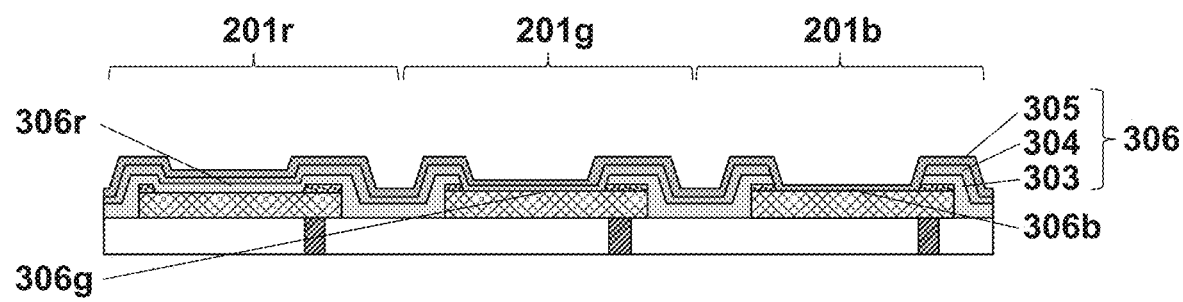
FIG. 5G is a view showing the method of manufacturing the organic device according to the second embodiment.

Next, in a step shown in FIG. 5E, for example, a second film 304a formed from an SiO₂ film is formed by the plasma CVD method. Next, in a step shown in FIG. 5F, portions, of the antireflection electrode 302, the first film 303b, and the second film 304a, located on the central portion of the reflective portion 301 of the third pixel 201b are removed by the photolithography step and the dry etching step. This forms the antireflection electrode 302, the first film 303, and the second film 304. Next, in a step shown in FIG. 5G, for example, the third film 305 formed from an SiO₂ film is formed by the plasma CVD method, thereby forming the optical adjustment film 306 formed from the first film 303, the second film 304, and the third film 305.

The optical adjustment film 306 includes the first optical adjustment film 306r for the first pixel 201r, the second optical adjustment film 306g for the second pixel 201g, and the third optical adjustment film 306b for the third pixel 201b. The first optical adjustment film 306r has the thickness Tr and the step ΔTr, the second optical adjustment film 306g has the thickness Tg and the step ΔTg, and the third optical adjustment film 306b has the thickness Tb and the step ΔTb. The method shown in FIGS. 5A to 5I can readily, accurately control the thicknesses of the optical adjustment films 306r, 306g, and 306b in the central portions of the reflective portions 110 for the first pixel 201r, the second pixel 201g, and the third pixel 201b. In this example, since the thickness of the optical adjustment film 114 can be controlled accurately, the optical characteristics such as the light emission efficiency and chromaticity of light emitting pixels can be controlled accurately. Unlike this method, there is also provided a method of controlling the thicknesses of the optical adjustment films 306r, 306g, and 306b in the central portions of the reflective portions 110 for the first pixel 201r, the second pixel 201g, and the third pixel 201b by the etching time. However, in the method of controlling the thicknesses by the etching time, it is difficult to accurately control the thicknesses.

Figure 5H:
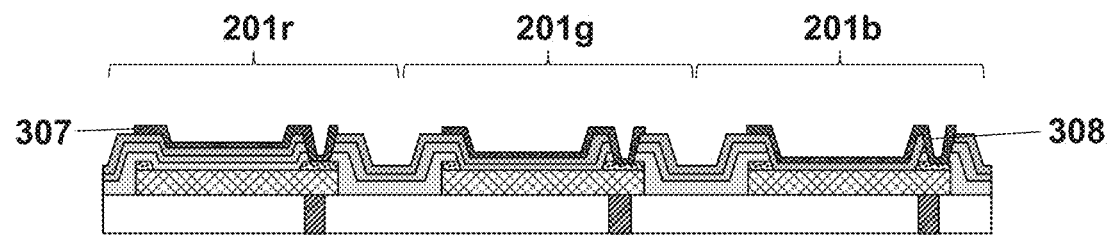
FIG. 5H is a view showing the method of manufacturing the organic device according to the second embodiment.

Next, in a step shown in FIG. 5H, the openings 308 (contact holes) are formed in the optical adjustment film 114 by the photolithography step and the dry etching step. After that, for example, an electrode film such as an ITO film or IZO film is formed by the sputtering method, and patterned by the photolithography step and the dry etching step, thereby forming the plurality of lower electrodes 307. In this manufacturing method, the edge of the photoresist pattern for forming the openings 308 and the lower electrodes 307 can be arranged in a region (the peripheral portion of the pixel) where the height difference is small between the pixels 201r, 201g, and 201b. Therefore, it is possible to reduce the process errors of the openings 308 and the lower electrodes 307 between the pixels 201r, 201g, and 201b. At least part of the end portion of each lower electrode 307 is particularly preferably arranged to be superimposed on the antireflection electrode 302 in the peripheral portion of the reflective portion 110 of each pixel in a planar view.

Figure 5I:
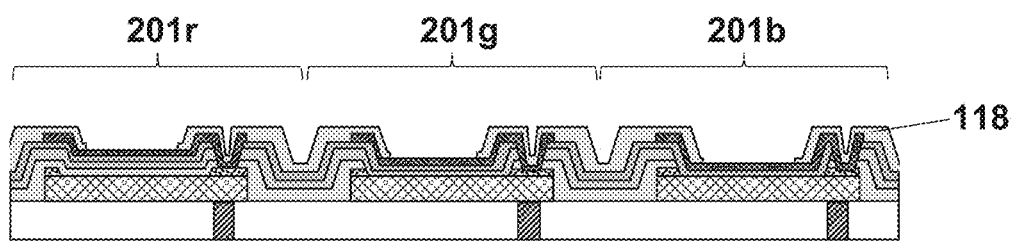
FIG. 5I is a view showing the method of manufacturing the organic device according to the second embodiment.

Next, in a step shown in FIG. 5I, for example, an SiO₂ film is formed by the plasma CVD method so as to cover the peripheral portion of each of the plurality of lower electrodes 307 and the optical adjustment film 306 between the plurality of lower electrodes 307. After that, the SiO₂ film is patterned by the photolithography step and the dry etching step, thereby forming the insulating film 118. With respect to the insulating film 118 as well, the process errors between the pixels 201r, 201g, and 201b can be reduced. Next, although not shown, for example, the organic function film 119 and the upper electrode 120 are sequentially formed using a deposition mask by a vacuum deposition method. After that, for example, the sealing film 121 is formed by the CVD method, and then, the color filter layer 122 can be formed by the photolithography method. Furthermore, a microlens may be formed above or below the color filter layer.

Figure 7B:
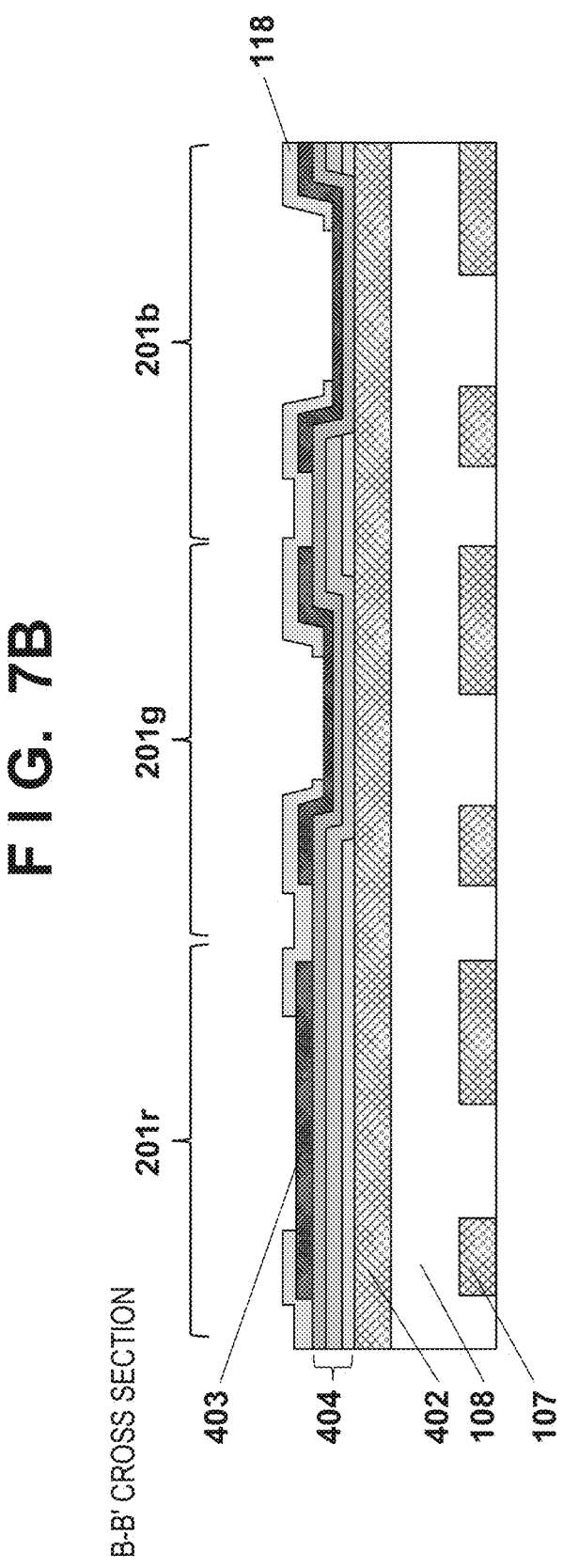
FIG. 7B is a view schematically showing the sectional structure of the organic device according to the third embodiment.

FIG. 6 schematically shows a plan view of an organic device according to the third embodiment. FIG. 7A schematically shows a sectional structure taken along a line A-A' in FIG. 6. FIG. 7B schematically shows a sectional structure taken along a line B-B' in FIG. 6. Matters that are not mentioned as the third embodiment can comply with the first or second embodiment. In the third embodiment, a third wiring layer including a reflective film 402 and wiring patterns 401 is arranged on a second interlayer insulating film 108. Each of first pixels 201r, second pixels 201b, and third pixels 201b includes a lower electrode 403. Each lower electrode 403 can have, for example, a hexagonal shape but may have another polygonal shape or a shape other than a polygon. The third wiring layer in which the reflective film 402 and the wiring patterns 401 are arranged is a wiring layer for electrically connecting the lower electrodes 403 and a lower wiring layer (not shown). The reflective film 402 and the wiring patterns 401 are electrically insulated. As shown in FIG. 7B, the reflective film 402 is a conductor commonly provided for the plurality of pixels including the first pixels 201r, the second pixels 201b, and the third pixels 201b. The reflective film 402 is not divided between the pixels, and spreads over the plurality of pixels in the pixel array region of the organic device. In this arrangement as well, the reflective film 402 can be considered to include a plurality of reflective portions respectively corresponding to the plurality of lower electrodes 403. It is also considered that the central portion of the reflective portion for each pixel is a portion overlapping the central portion of the lower electrode 403 arranged on the reflective portion, and the peripheral portion of the reflective portion for each pixel is a portion overlapping the peripheral portion of the lower electrode 403 arranged on the reflective portion.

An optical adjustment film 404 according to the first or second embodiment is arranged on the reflective film 402 and the wiring patterns 401. The lower electrodes 403 can be arranged on the optical adjustment film 404. The lower electrodes 403 and the wiring patterns 401 of the third wiring layer can electrically be connected in openings 405 formed in the optical adjustment film 404.

In the third embodiment, the potential of the reflective film 402 can arbitrarily be set. The potential of the reflective film 402 is particularly preferably set so that the potential difference between the upper electrode and the reflective film 402 is lower than the light emission threshold voltage of the organic function film (a threshold voltage at which an organic function film operates). When the reflective film 402 is electrically connected to the wiring pattern 401 of a given pixel due to manufacturing variations, the potential of the wiring pattern 401 becomes equal to the potential of the reflective film 402. Since the potential of the wiring pattern 401 and that of the lower electrode 403 are equal to each other, if the potential difference between the reflective film 402 and the upper electrode is set to a value equal to or lower than the light emission threshold voltage of the organic light emitting element, the pixel in which the reflective film 402 and the lower electrode 403 are electrically connected emits no light, and thus no large pixel defect occurs.

Figure 8:
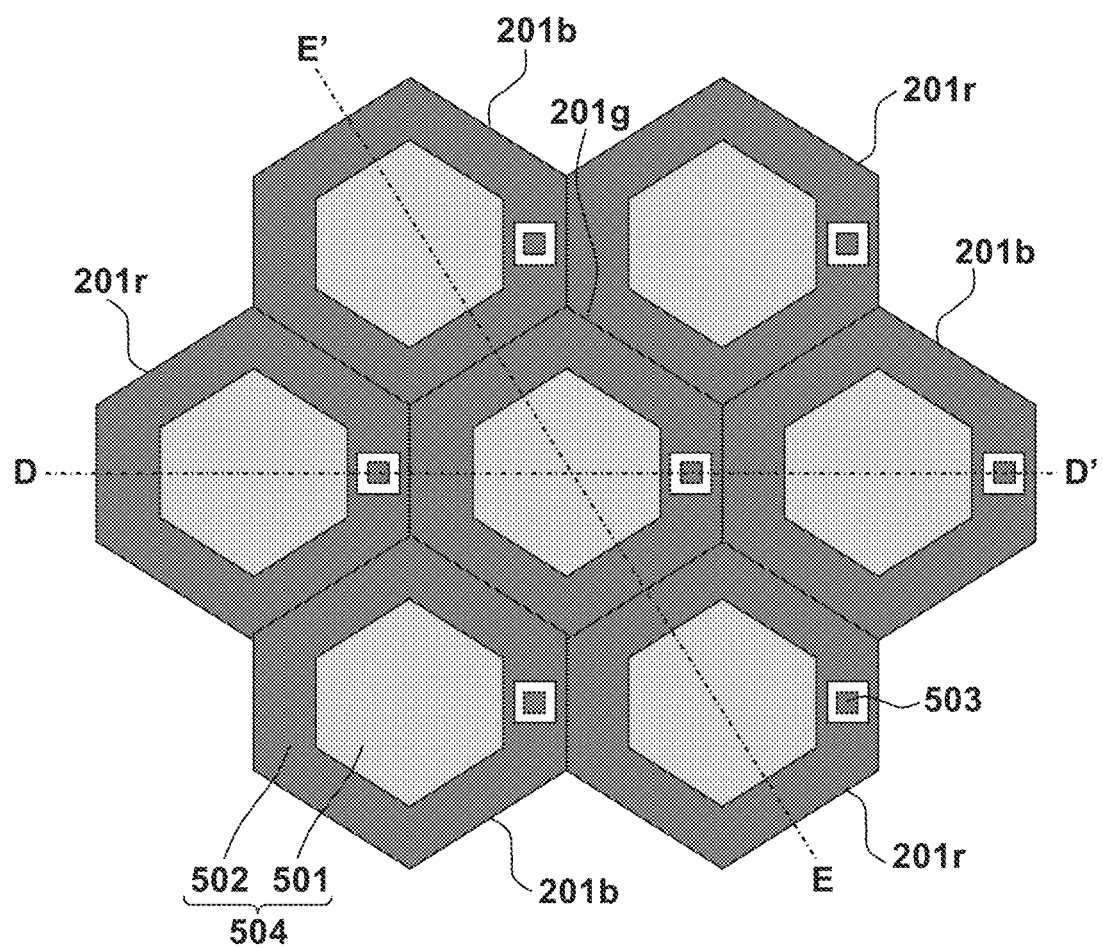
FIG. 8 is a view schematically showing a plan view of an organic device according to the fourth embodiment.
Figure 9A:
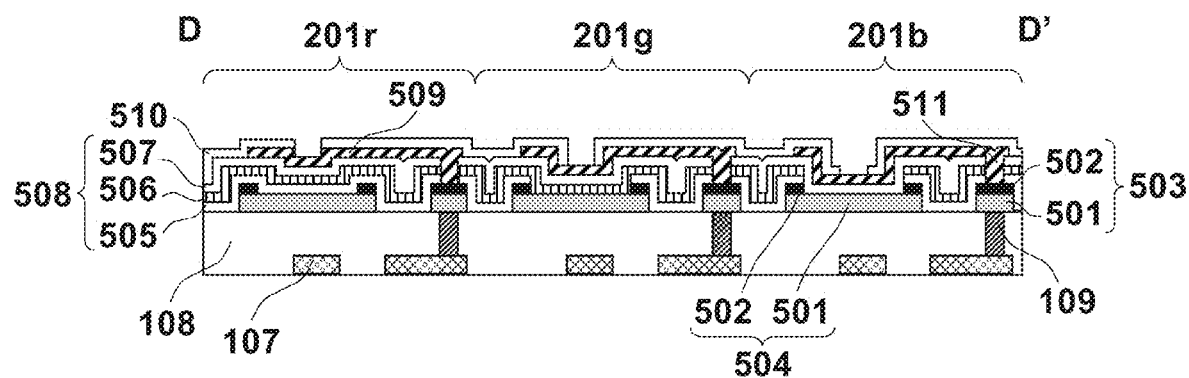
FIG. 9A is a view schematically showing the sectional structure of the organic device according to the fourth embodiment.
Figure 9B:
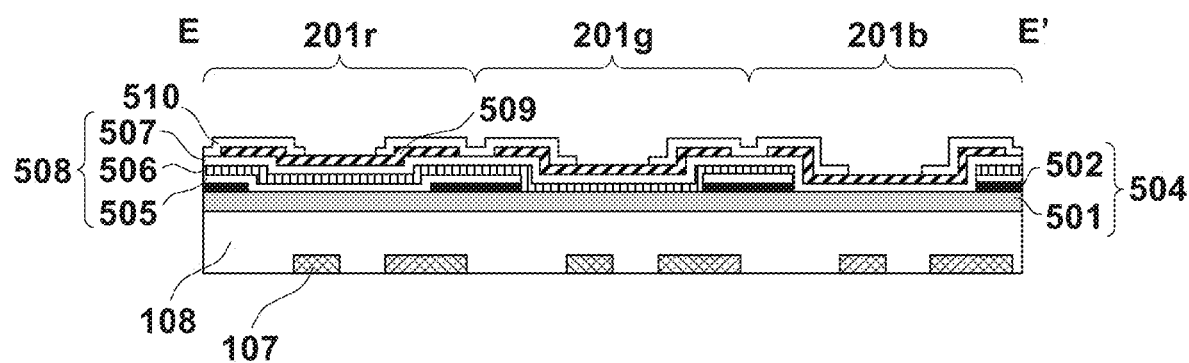
FIG. 9B is a view schematically showing the sectional structure of the organic device according to the fourth embodiment.

FIG. 8 is a view showing the planar arrangement of a third wiring layer according to the fourth embodiment. FIG. 9A schematically shows a sectional structure taken along a line D-D' in FIG. 8. FIG. 9B schematically shows a sectional structure taken along a line E-E' in FIG. 8. Matters that are not mentioned as the fourth embodiment can comply with the first to third embodiments. In the fourth embodiment, the third wiring layer including a reflective film 504 and wiring patterns 503 is arranged on a second interlayer insulating film 108. Each of first pixels 201r, second pixels 201b, and third pixels 201b includes a lower electrode 509. Each lower electrode 509 can have, for example, a hexagonal shape but may have another polygonal shape or a shape other than a polygon. As a pixel array, an arbitrary array such as a stripe array, a delta array, a Bayer array, or a pentile array can be adopted. Especially, the delta array is preferable since a circular microlens is readily arranged. The third wiring layer in which the reflective film 504 and the wiring patterns 503 are arranged is a wiring layer for electrically connecting the lower electrodes 509 and a lower wiring layer. The reflective film 504 and the wiring patterns 503 are electrically insulated by removing a conductive material 502 on a reflective material 501 in the third wiring layer. As shown in FIG. 9A, the wiring pattern 503 has a structure in which the conductive material 502 is stacked on the reflective material 501. The reflective material 501 need only be reflective and conductive, and is preferably, for example, a high-reflectance material such as Al, Ag, or Pt. Furthermore, the reflective material 501 may be an alloy containing such material, and have a stacked structure. An alloy containing Al is particularly preferable. The conductive material 502 need only be conductive, and is particularly preferably a material that is stable when it contacts the reflective material 501 and the lower electrode 509. Furthermore, the conductive material 502 preferably has a low reflectance, and particularly preferably contains TiN or Ti. The film thickness of the conductive material 502 is preferably about 1 to 100 nm.

As shown in FIG. 9B, the reflective film 504 is a conductor commonly provided for the plurality of pixels including the first pixels 201r, the second pixels 201b, and the third pixels 201b, and is formed by the reflective material 501 and the conductive material 502. The reflective film 504 is not divided between the pixels, and spreads over the plurality of pixels in the pixel array region of an organic device. In this arrangement as well, the reflective film 504 can be considered to include a plurality of reflective portions respectively corresponding to the plurality of lower electrodes 403. It is also considered that the central portion of the reflective portion for each pixel is a portion overlapping the central portion of the lower electrode 403 arranged on the reflective portion in a planar view, and the peripheral portion of the reflective portion for each pixel is a portion overlapping the peripheral portion of the lower electrode 403 arranged on the reflective portion in planar view. In the reflective portions of the reflective film 504, the conductive material 502 is removed to expose the reflective material 501. In at least part of the peripheral portion of each reflective portion, the conductive material 502 is provided. In the peripheral portion of each reflective portion, the conductive material 502 is particularly preferably provided to surround the central portion of the reflective portion. Furthermore, the conductive material 502 is preferably provided between the first pixels 201r, the second pixels 201b, and the third pixels 201b. By using, as the conductive material 502 provided in the peripheral portion of each reflective portion, a material having a reflectance lower than that of the reflective material 501, it is possible to reduce stray light and improve contrast.

An optical adjustment film 508 according to the optical adjustment film of each of the first to third embodiments is arranged on the reflective film 504 and the wiring patterns 503. The plurality of lower electrodes 509 can be arranged on the optical adjustment film 508. An organic device 1 can further include an insulating film 510 that covers the peripheral portion of each of the plurality of lower electrodes 509 and the optical adjustment film 508 between the plurality of lower electrodes 509. The insulating film 510 corresponds to the insulating film 118 in the first embodiment. The lower electrodes 509 and the wiring patterns 503 of the third wiring layer can electrically be connected in openings 511 formed in the optical adjustment film 508. Since the reflective film 504 and the plurality of wiring patterns 503 arranged in the third wiring layer are electrically insulated, the plurality of lower electrodes 509 corresponding to the plurality of wiring patterns can electrically be connected.

In the fourth embodiment, the potential of the reflective film 504 can arbitrarily be set. The potential of the reflective film 504 is particularly preferably set so that the potential difference between the reflective film 504 and the upper electrode is equal to or lower than the light emission threshold voltage of an organic light emitting element. When the reflective film 504 is electrically connected to the wiring pattern 503 of a given pixel due to manufacturing variations, the potential of the wiring pattern 503 becomes equal to the potential of the reflective film 504. If the potential difference between the reflective film 504 and the upper electrode is set to a value equal to or lower than the light emission threshold voltage of the organic light emitting element, the pixel electrically connected to the reflective film 504 emits no light, and thus no large pixel defect occurs.

Figure 10:
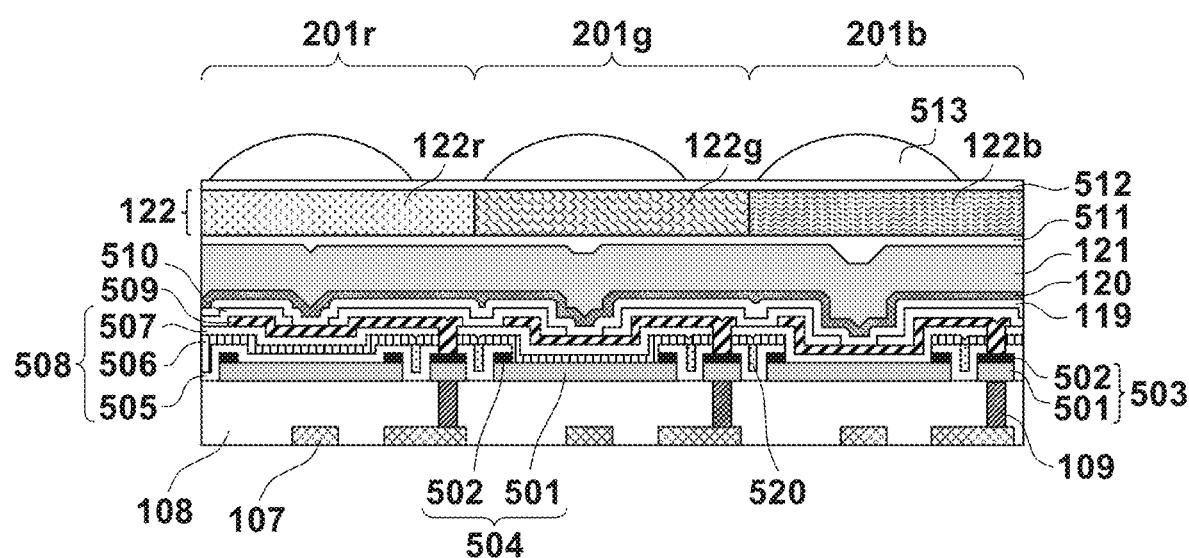
FIG. 10 is a view schematically showing the sectional structure of an organic device according to the fifth embodiment.

FIG. 10 schematically shows a sectional view of an organic device according to the fifth embodiment. Matters that are not mentioned as the fifth embodiment can comply with the first to fourth embodiments. In the fifth embodiment, a gap 520 is provided between a reflective film 504 and a wiring pattern 503. By providing the gap 520, the insulating property between the reflective film 504 and the wiring pattern 503 formed in the same layer can be improved. Especially, if the potential of the reflective film 504 is different from that of the wiring pattern 503, it is possible to suppress occurrence of a leakage current between the reflective film 504 and the wiring pattern 503 by improving the insulating property between the reflective film 504 and the wiring pattern 503. The gap 520 is particularly preferably provided to surround the outer periphery of the wiring pattern. The gap 520 is preferably filled with a vacuum or inert gas. Furthermore, if the reflective film is electrically isolated and provided for each pixel, the gap 520 is preferably provided between the reflective films for the respective pixels. The gap 520 can be formed by an arbitrary method. For example, the gap 520 can be formed by etching an optical adjustment film 508 in a groove shape. As another method, the gap 502 can be formed by forming the reflective film 504 or the wiring pattern 503 of the third wiring layer by etching, and forming the optical adjustment film 508 by a film forming method of relatively isotropic growth. In addition, an upper portion of the gap 502 is preferably covered with an insulating film, and is more preferably covered with the optical adjustment film 508.

A modification of the above embodiments will be described below. An organic EL element (organic light emitting element) can have a structure in which an anode, an organic compound layer (organic function film), and a cathode are arranged on a substrate. A protection layer, a color filter, and the like may be provided on the cathode. If a color filter is provided, a planarizing layer can be provided between the protection layer and the color filter. The planarizing layer can be made of acrylic resin or the like.

Quartz, glass, a silicon wafer, a resin, a metal, or the like may be used as a substrate. Furthermore, a switching element such as a transistor and a wiring may be provided on the substrate, and an insulating layer may be provided thereon. The insulating layer may be made of any material as long as a contact hole can be formed to ensure a conductive state between the anode 2 and the wiring and insulation from the unconnected wiring can be ensured. For example, a resin such as polyimide, silicon oxide, silicon nitride, or the like can be used.

A pair of electrodes can be used as the electrodes. The pair of electrodes can be an anode and a cathode. When an electric field is applied in the direction in which the organic light emitting element emits light, the electrode having a high potential is the anode, and the other is the cathode. It can also be said that the electrode that supplies holes to the light emitting layer is the anode and the electrode that supplies electrons is the cathode. In this example, an arrangement in which the lower electrode is the anode and the upper electrode is the cathode or an arrangement in which the lower electrode is the cathode and the upper electrode is the anode may be adopted. The lower electrode and the upper electrode need only have transparency, and may have reflectivity and absorptivity.

As the constituent material of the anode, a material having a work function as large as possible is preferably used. For example, a metal such as gold, platinum, silver, copper, nickel, palladium, cobalt, selenium, vanadium, or tungsten, a mixture containing some of them, or an alloy obtained by combining some of them can be used. Furthermore, for example, a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used.

One of these electrode materials may be used singly, or two or more of them may be used in combination. The anode may be formed by a single layer or a plurality of layers.

When the electrode is used as a reflective film, for example, chromium, aluminum, silver, titanium, tungsten, molybdenum, an alloy thereof, a stacked layer thereof, or the like can be used. When the electrode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function is preferably used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multi-layer structure. Among others, silver is preferably used. To suppress aggregation of silver, a silver alloy is more preferably used. The ratio of the alloy is not limited as long as aggregation of silver can be suppressed. For example, the ratio may be 1:1. The method of forming the cathode is not particularly limited, but a deposition heating method, a direct current sputtering method, or an alternating current sputtering method can be used. The direct current sputtering method or the alternating current sputtering method is preferably used since the good film coverage is provided and the resistance is easily lowered.

A protection layer may be provided on the upper electrode. For example, by adhering glass provided with a moisture absorbing agent on the cathode, permeation of water or the like into the organic compound layer can be suppressed and occurrence of display defects can be suppressed. Furthermore, as another embodiment, a passivation film made of silicon nitride or the like may be provided on the cathode to suppress permeation of water or the like into the organic EL layer. For example, the protection layer can be formed by forming the cathode, transferring it to another chamber without breaking the vacuum, and forming a silicon nitride film having a thickness of 2 µm by a CVD method. The protection layer may be provided using an atomic deposition method (ALD method) after forming a film using the CVD method.

A color filter may be provided on the protection layer. For example, a color filter considering the size of the organic light emitting element may be provided on another substrate, and this substrate may be bonded to the substrate with the organic light emitting element provided thereon. Alternatively, a color filter may be patterned on the above-described protection layer using a photolithography technique. The color filter can be formed from a polymeric material. Furthermore, a microlens may be formed above or below the color filter layer.

A planarizing layer may be provided between the color filter and the protection layer. The planarizing layer can be formed from an organic compound, and can be made of a low-molecular material or a polymeric material. However, a polymetric material is more preferable.

The planarizing layers may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

A counter substrate can be provided on the planarizing layer. The counter substrate is called a counter substrate because it is provided at a position corresponding to the above-described substrate. The constituent material of the counter substrate can be the same as that of the above-described substrate.

The organic compound layer (hole injection layer, hole transport layer, electron blocking layer, light emitting layer, hole blocking layer, electron transport layer, electron injection layer, and the like) forming the organic light emitting element according to an embodiment of the present invention is formed by the method to be described below.

The organic compound layer forming the organic light emitting element according to the embodiment of the present invention can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, these are merely examples and the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

The application of the organic device will exemplarily be described below. The organic device can be used as a constituent member of a display device or an illumination device. In addition, the organic device is applicable to the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

The display device according to the embodiment will be described next with reference to the accompanying drawings.

Figure 11:
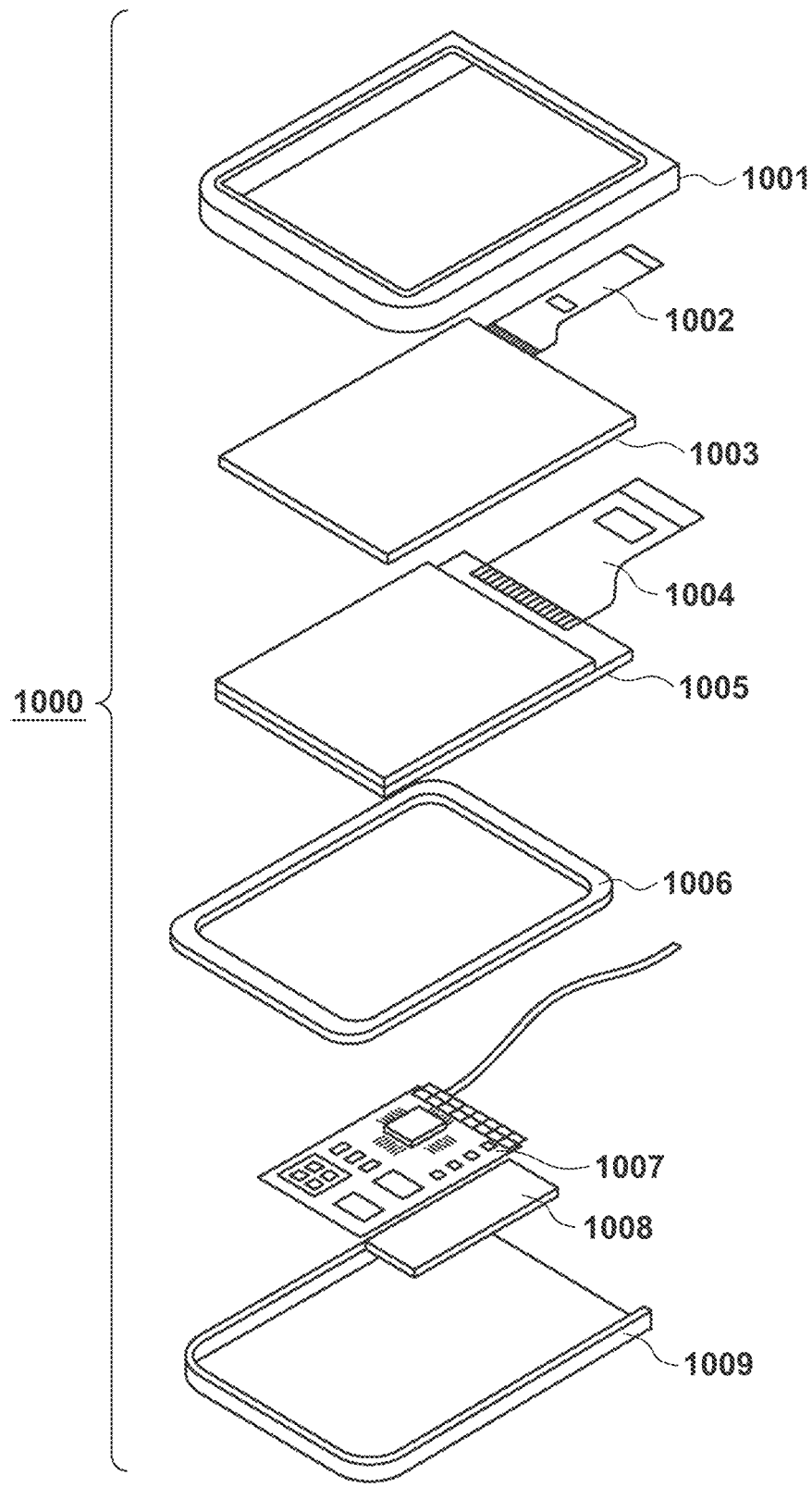
FIG. 11 is a schematic view showing an example of a display device.

FIG. 11 is a schematic view showing an example of the display device according to this embodiment. A display device 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Transistors are printed on the circuit board 1007. The battery 1008 is unnecessary if the display device is not a portable apparatus. Even when the display device is a portable apparatus, the battery 1008 may be arranged at another position. The display panel 1005 can be formed by the organic device 1.

The display device according to this embodiment can be used for a display unit of a photoelectric conversion device including an optical unit having a plurality of lenses, and an image sensor for receiving light having passed through the optical unit. The photoelectric conversion device can include a display unit for displaying information acquired by the image sensor. In addition, the photoelectric conversion device may acquire information using the information acquired by the image sensor, and the display unit may display other information. The display unit can be either a display unit exposed outside the photoelectric conversion device, or a display unit arranged in the finder. The photoelectric conversion device can be a digital camera or a digital video camera.

Figure 12A:
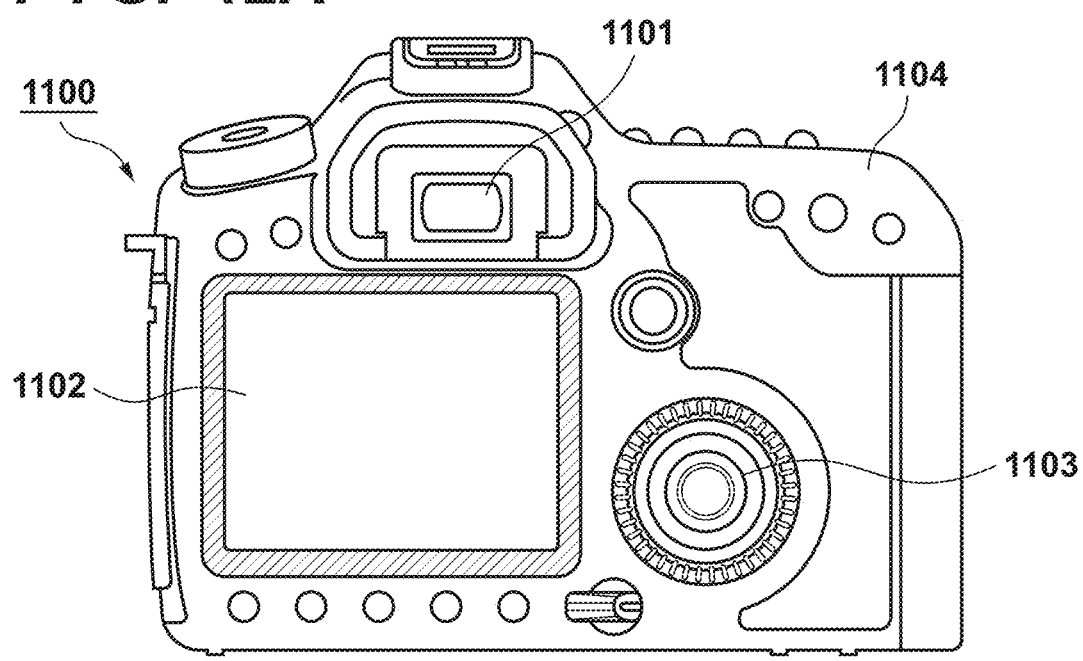
FIG. 12A is a schematic view showing an example of the display device.

FIG. 12A is a schematic view showing an example of the photoelectric conversion device according to this embodiment. A photoelectric conversion device 1100 can include a viewfinder 1101, a rear display 1102, an operation unit 1103, and a housing 1104. The viewfinder 1101 can include the display device according to this embodiment. In this case, the display device can display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time, so the information is preferably displayed as soon as possible. Therefore, the display device using the organic light emitting element of the present invention is preferably used. This is so because the organic light emitting element has a high response speed. The display device using the organic light emitting element can be used for the apparatuses that require a high display speed more preferably than for the liquid crystal display device.

The photoelectric conversion device 1100 includes an optical unit (not shown). This optical unit has a plurality of lenses, and forms an image on an image sensor that is accommodated in the housing 1104. The focal points of the plurality of lenses can be adjusted by adjusting the relative positions. This operation can also automatically be performed.

The display device according to this embodiment can include color filters of red, green, and blue. The color filters of red, green, and blue can be arranged in a delta array.

The display device according to this embodiment can also be used for a display unit of a portable terminal. At this time, the display unit can have both a display function and an operation function. Examples of the portable terminal are a portable phone such as a smartphone, a tablet, and a head mounted display.

Figure 12B:
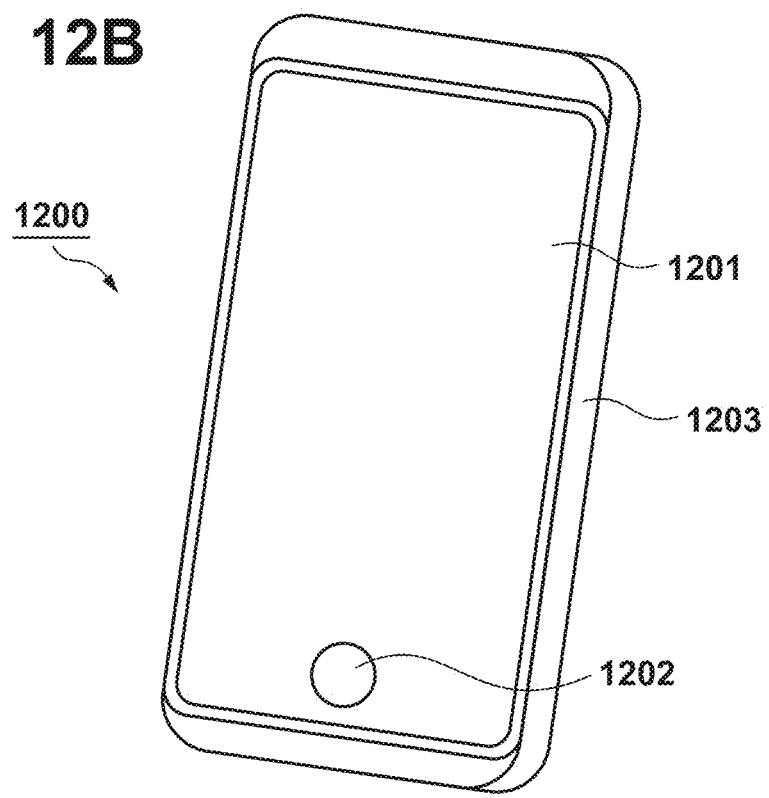
FIG. 12B is a schematic view showing an example of the display device.

FIG. 12B is a schematic view showing another example of an electronic apparatus according to this embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 can be a button or a touch-panel-type reaction unit. The operation unit can also be a biometric authentication unit that performs unlocking or the like by authenticating the fingerprint. The electronic apparatus including the communication unit can also be regarded as a communication apparatus.

Figure 13A:
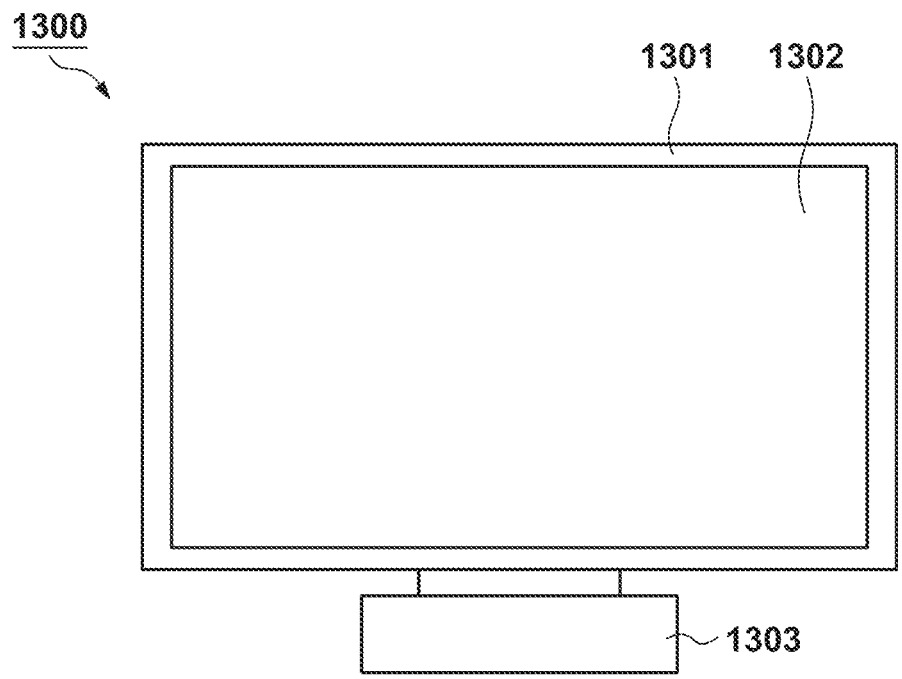
FIG. 13A is a schematic view showing an example of the display device.
Figure 13B:
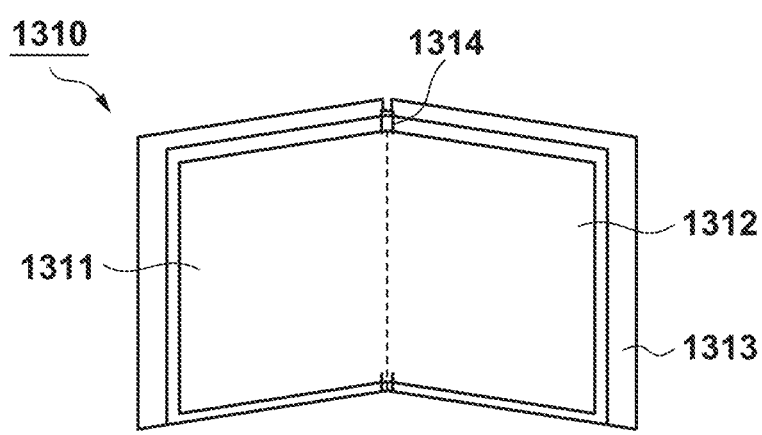
FIG. 13B is a schematic view showing an example of the display device.

FIGS. 13A and 13B are schematic views showing examples of the display device according to this embodiment. FIG. 13A shows a display device such as a television monitor or a PC monitor. A display device 1300 includes a frame 1301 and a display unit 1302. The light emitting device according to this embodiment can be used for the display unit 1302. The display device 1300 includes a base 1303 that supports the frame 1301 and the display unit 1302. The base 1303 is not limited to the form shown in FIG. 13A. The lower side of the frame 1301 may also function as the base. In addition, the frame 1301 and the display unit 1302 can be bent. The radius of curvature in this case can be 5,000 (inclusive) mm to 6,000 (inclusive) mm.

FIG. 13B is a schematic view showing another example of the display device according to this embodiment. A display device 1310 shown in FIG. 13B can be folded, that is, the display device 1310 is a so-called foldable display device. The display device 1310 includes a first display unit 1311, a second display unit 1312, a housing 1313, and a bending point 1314. Each of the first display unit 1311 and the second display unit 1312 can include the light emitting device according to this embodiment. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 14A:
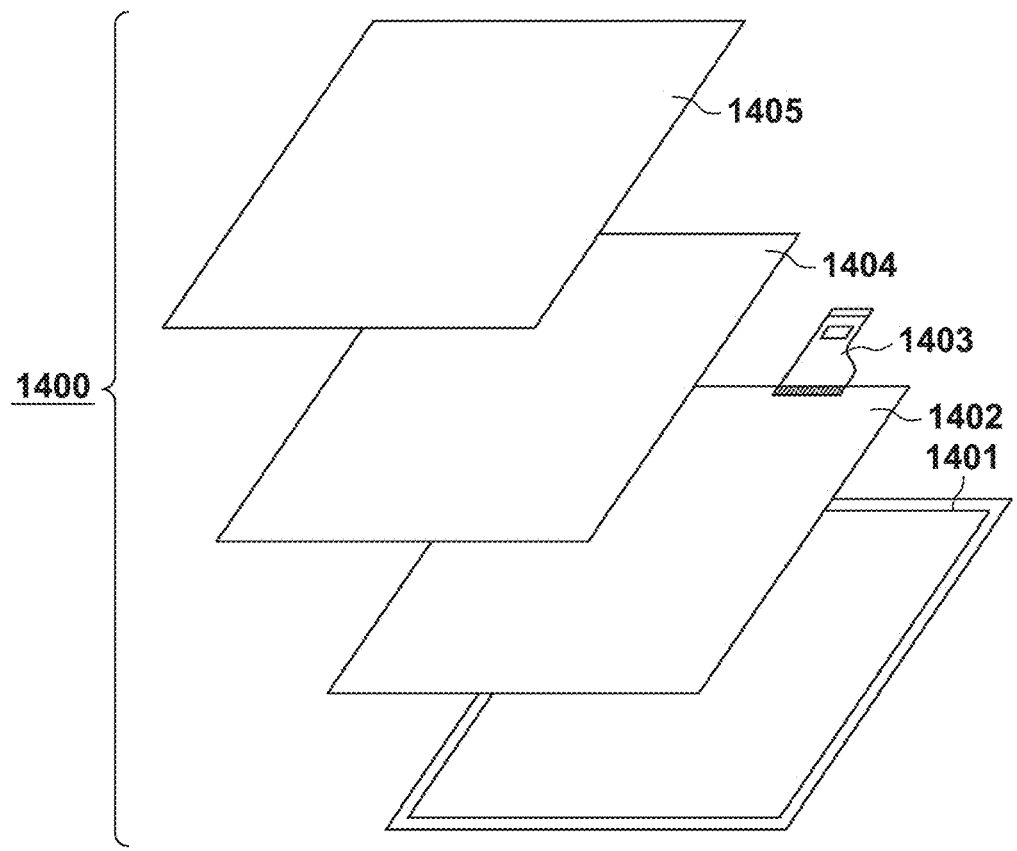
FIG. 14A is a schematic view showing an example of an illumination device.

FIG. 14A is a schematic view showing an example of the illumination device according to this embodiment. An illumination device 1400 can include a housing 1401, a light source 1402, a circuit board 1403, an optical film 1404, and a light-diffusing unit 1405. The light source can include the organic light emitting element according to this embodiment. The optical filter can be a filter that improves the color rendering of the light source. When performing lighting-up or the like, the light-diffusing unit can throw the light of the light source over a broad range by effectively diffusing the light. The optical filter and the light-diffusing unit can be provided on the illumination light emission side. The illumination device can also include a cover on the outermost portion, as needed.

The illumination device is, for example, a device for illuminating the interior of the room. The illumination device can emit white light, natural white light, or light of any color from blue to red. The illumination device can also include a light control circuit for controlling these light components. The illumination device can also include the organic light emitting element according to the present invention and a power supply circuit connected to the organic light emitting element. The power supply circuit is a circuit for converting an AC voltage into a DC voltage. White has a color temperature of 4,200 K, and natural white has a color temperature of 5,000 K. The illumination device may also include a color filter.

In addition, the illumination device according to this embodiment can include a heat radiation unit. The heat radiation unit radiates the internal heat of the device to the outside of the device, and examples are a metal having a high specific heat and liquid silicon.

Figure 14B:
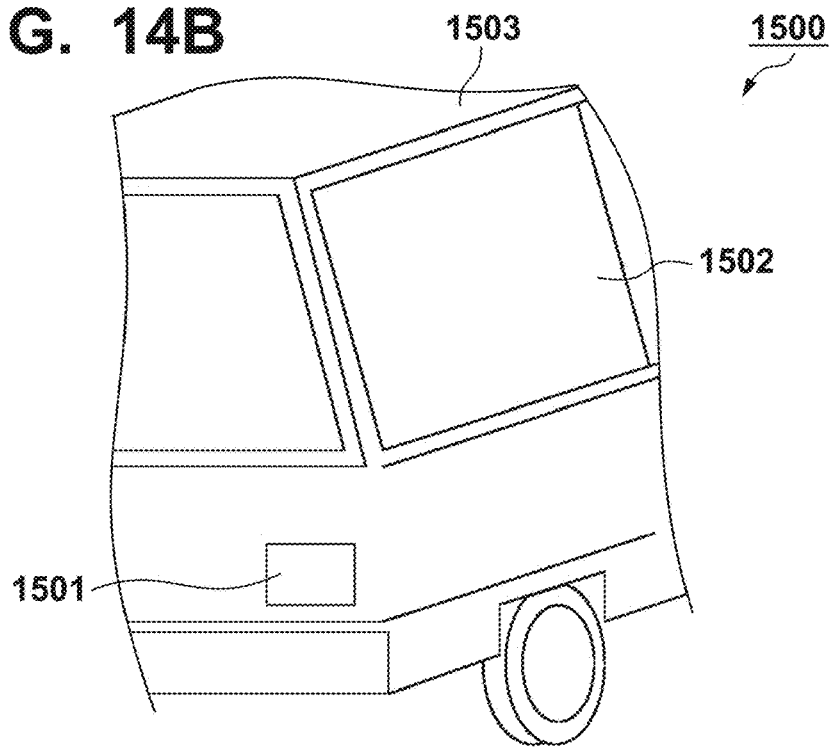
FIG. 14B is a schematic view showing an example of a moving body.

FIG. 14B is a schematic view of an automobile as an example of a moving body according to this embodiment. The automobile has a taillight as an example of the lighting appliance. An automobile 1500 has a taillight 1501, and can have a form in which the taillight is turned on when performing a braking operation or the like.

The taillight 1501 can include the organic light emitting element according to this embodiment. The taillight can include a protection member for protecting the organic EL element. The material of the protection member is not limited as long as the material is a transparent material with a strength that is high to some extent, and is preferably polycarbonate. A furandicarboxylic acid derivative, an acrylonitrile derivative, or the like may be mixed in polycarbonate.

The automobile 1500 can include a vehicle body 1503, and a window 1502 attached to the vehicle body 1503. This window can be a window for checking the front and back of the automobile, and can also be a transparent display. This transparent display can include the organic light emitting element according to this embodiment. In this case, the constituent materials of the electrodes and the like of the organic light emitting element are preferably formed by transparent members.

The moving body according to this embodiment can be a ship, an airplane, a drone, or the like. The moving body can include a main body and a lighting appliance installed in the main body. The lighting appliance can emit light for making a notification of the position of the main body. The lighting appliance includes the organic light emitting element according to this embodiment.

As described above, when a device using the organic light emitting element according to this embodiment is used, stable display with high image quality can be performed even in long time display.

Figure 15A:
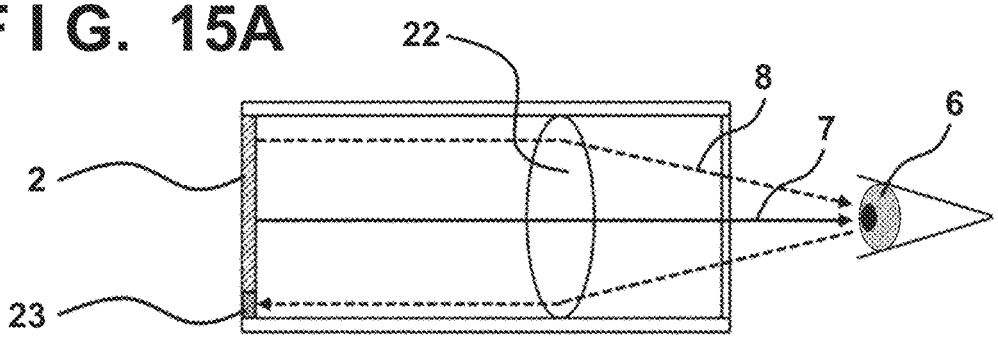
FIG. 15A is a view showing a display image capturing device.
Figure 15B:
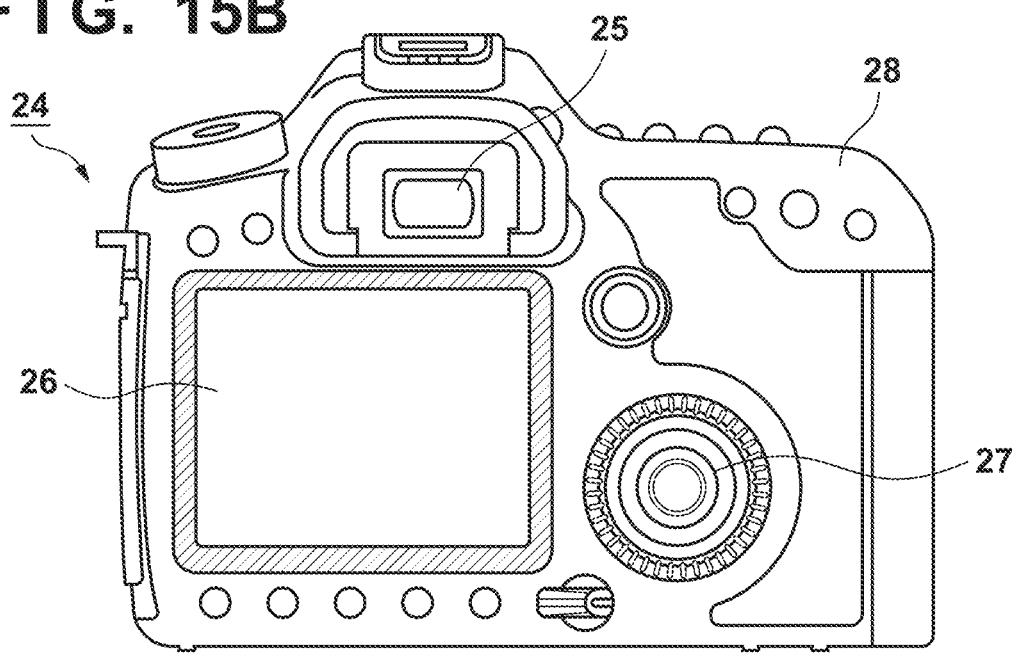
FIG. 15B is a view showing a display image capturing device.
Figure 15C:
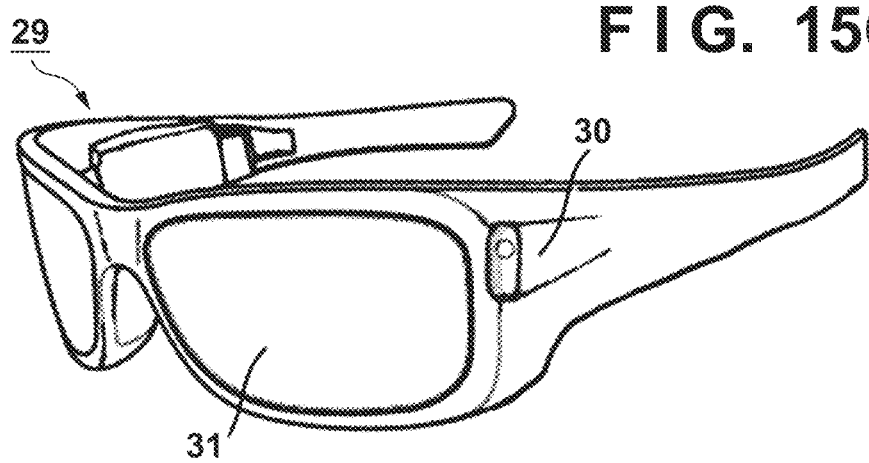
FIG. 15C is a view showing a display image capturing device.

FIGS. 15A to 15C show application examples of the display device according to an embodiment of the present invention. The display device according to the embodiment of the present invention can be applied to an information display device such as the viewfinder of a camera, a head mounted display, or smartglasses.

FIG. 15A is a view showing an example of a schematic arrangement in which the display device is used as the viewfinder of an image capturing device such as a camera. A display device 1 emits display light 7 and infrared light 8, and the display light and the infrared light pass through one optical member 22 to reach an eyeball 6 of a user. An image capturing device 23 including an image sensor converts, into electrical information, the infrared light reflected by the eyeball 6 of the user, and a line of sight is detected based on the information. Instead of providing the image capturing device, an image sensor may be provided on the insulating layer of the display device 1, and used as a display image capturing device.

FIG. 15B shows an example of the image capturing device such as a camera. An image capturing device 24 includes a viewfinder 25, a display 26, an operation unit 27, and a housing 28. The display device shown in FIG. 15A is provided in the viewfinder 25.

FIG. 15A shows the example in which the display light 7 and the infrared light 8 pass through the same optical member 22. However, different optical members may be provided for the display light and the infrared light, respectively. Furthermore, instead of providing the image capturing device, an image sensor may be provided on the substrate of the display device 1, and used as a display image capturing device. The detected line-of-sight information can be used for control of the display device and various kinds of apparatuses connected to the display device, such as focus control of the camera, resolution control of a displayed image, and substitution for a button operation.

The display device according to the embodiment of the present invention can include an image capturing device including a light receiving element, and a displayed image on the display device can be controlled based on the line-of-sight information of the user from the image capturing device.

More specifically, the display device can decide a first visual field region at which the user is gazing and a second visual field region other than the first visual field region based on the line-of-sight information. The first visual field region and the second visual field region may be decided by the control device of the display device, or those decided by an external control device may be received. In the display region of the display device, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first visual field region and the second visual field region may be decided by the control device of the display device, or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the display device, the image capturing device, or an external device. If the external device holds the AI program, it is transmitted to the display device via communication.

When performing display control based on line-of-sight detection, smartglasses further including an image capturing device configured to capture the outside can preferably be applied. The smartglasses can display captured outside information in real time.

In addition, the first image capturing device including a light receiving element configured to receive infrared light and the second image capturing device, for capturing the outside, including a light receiving element different from that of the first image capturing device can be provided, and the image capturing resolution of the second image capturing device can be controlled based on line-of-sight information of the user of the first image capturing device. By setting a low image capturing resolution in another region, as compared with a prioritized region, an information amount can be reduced. Thus, an attempt can be made to reduce power consumption and a display delay. The prioritized region may be set as the first image capturing region, and a region of lower priority than that of the first image capturing region may be set as the second image capturing region.

FIG. 15C is a schematic view showing an example of the smartglasses. An image capturing display device 29 represented by smartglasses includes a control unit 30, a transparent display unit 31, and an external image capturing unit (not shown). If the present invention is applied to the smartglasses, it is possible to control both the display device and the external image capturing device based on detected line-of-sight information, and make an attempt to reduce power consumption and a display delay. For example, by decreasing the image capturing resolution and display resolution of a region other than a region at which the user is gazing in the display region, it is possible to reduce the information amount with respect to image capturing and display, and reduce power consumption and a display delay.

As describe above, according to the embodiment of the present invention, by reducing a case in which visible light emitted by an infrared light emitting element becomes leakage light of an adjacent pixel, it is possible to provide a display device for which degradation of display quality is suppressed even if the display device is downsized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An organic device comprising:
   a reflective film arranged on a substrate,
   a first insulating film configured to cover the reflective film,
   a plurality of lower electrodes arranged on the first insulating film, a second insulating film configured to cover a peripheral portion of each of the plurality of lower electrodes and the first insulating film between the plurality of lower electrodes, an organic function film configured to cover the plurality of lower electrodes and the second insulating film, and an upper electrode arranged on the organic function film, wherein the reflective film includes a plurality of reflective portions, the plurality of reflective portions including a first reflective portion for a first pixel and a second reflective portion for a second pixel, wherein T1>T2 and ΔT1<ΔT2 are satisfied, where T1 represents a thickness of the first insulating film arranged on a central portion of the first reflective portion, T2 represents a thickness of the first insulating film arranged on a central portion of the second reflective portion, ΔT1 represents a difference in thickness between a peripheral portion and a central portion of the first insulating film respectively arranged on a peripheral portion and the central portion of the first reflective portion, and ΔT2 represents a difference in thickness between a peripheral portion and a central portion of the first insulating film respectively arranged on a peripheral portion and the central portion of the second reflective portion, wherein the peripheral portion of the first reflective portion indicates a portion within a range of D1/8 from an end portion of the first reflective portion toward a barycenter of the first reflective portion, and the central portion of the first reflective portion indicates a portion within a range of D1/3 from the barycenter of the first reflective portion where D1 represents a distance from the barycenter of the first reflective portion to the end portion of the first reflective portion, wherein the peripheral portion of the second reflective portion indicates a portion within a range of D2/8 from an end portion of the second reflective portion toward a barycenter of the second reflective portion, and the central portion of the second reflective portion indicates a portion within a range of D2/3 from the barycenter of the second reflective portion where D2 represents a distance from the barycenter of the second reflective portion to the end portion of the second reflective portion, wherein each of the plurality of reflective portions is arranged under a corresponding one of the plurality of lower electrodes, and each of the plurality of lower electrodes and a corresponding one of the plurality of reflective portions are electrically connected to each other, and wherein each of the plurality of lower electrodes extends to a corresponding one of a plurality of openings formed in the first insulating film, and is electrically connected, in the corresponding opening, to a peripheral portion of a corresponding one of the plurality of reflective portions.

2. The organic device according to claim 1, wherein the first insulating film includes a first film and a second film, the first film and the second film are arranged in the central portion of the first reflective portion, and not the first film but the second film is arranged in the central portion of the second reflective portion.

3. The organic device according to claim 2, wherein in a region where both the first film and the second film exist, the second film is arranged on the first film.

4. The organic device according to claim 1, wherein the first insulating film includes a first film, a second film, and a third film, the first film, the second film, and the third film are arranged in the central portion of the first reflective portion, not the first film but the second film and the third film are arranged in the central portion of the second reflective portion, and not the first film and the second film but the third film is arranged in the central portion of the third reflective portion.

5. The organic device according to claim 1, wherein the conductive layer is made of a material having a reflectance lower than a reflectance of the reflective film.

6. The organic device according to claim 1, wherein the reflective film includes a first reflective portion for a first pixel and a second reflective portion for a second pixel, and wherein a gap is provided at least between the first reflective portion and the second reflective portion.

7. The organic device according to claim 1, wherein the organic device is configured as a display device.

8. A display image capturing device comprising:
an image capturing device; and
an organic device defined in claim 1 and configured as a display device,
wherein a displayed image on the display device is controlled based on line-of-sight information of a user provided from the image capturing device.

9. An image capturing device comprising:
an optical unit having a plurality of lenses;
an image sensor configured to receive light having passed through the optical unit; and
a display unit configured to display an image captured by the image sensor,
wherein the display unit includes an organic device defined in claim 1.

10. An electronic apparatus comprising:
a display unit including an organic device defined in claim 1;
a housing provided with the display unit; and
a communication unit provided in the housing and configured to perform external communication.

11. An illumination device comprising:
a light source including an organic device defined in claim 1; and
one of a light-diffusing unit and an optical film configured to transmit light emitted by the light source.

12. A moving body comprising:
a lighting appliance including an organic device defined in claim 1; and
a main body provided with the lighting appliance.

13. A moving body comprising:
a lighting appliance including an organic device defined in claim 1; and
a main body provided with the lighting appliance.

14. An organic device comprising:
a reflective film arranged on a substrate,
a first insulating film configured to cover the reflective film,
a plurality of lower electrodes arranged on the first insulating film,
a second insulating film configured to cover a peripheral portion of each of the plurality of lower electrodes and the first insulating film between the plurality of lower electrodes,
an organic function film configured to cover the plurality of lower electrodes and the second insulating film, and
an upper electrode arranged on the organic function film,
wherein the reflective film includes a plurality of reflective portions, the plurality of reflective portions including a first reflective portion for a first pixel and a second reflective portion for a second pixel, wherein T1>T2 and ΔT1<ΔT2 are satisfied, where T1 represents a thickness of the first insulating film arranged on a central portion of the first reflective portion, T2 represents a thickness of the first insulating film arranged on a central portion of the second reflective portion, ΔT1 represents a difference in thickness between a peripheral portion and a central portion of the first insulating film respectively arranged on a peripheral portion and the central portion of the first reflective portion, and ΔT2 represents a difference in thickness between a peripheral portion and a central portion of the first insulating film respectively arranged on a peripheral portion and the central portion of the second reflective portion, wherein the peripheral portion of the first reflective portion indicates a portion within a range of D1/8 from an end portion of the first reflective portion toward a barycenter of the first reflective portion, and the central portion of the first reflective portion indicates a portion within a range of D1/3 from the barycenter of the first reflective portion where D1 represents a distance from the barycenter of the first reflective portion to the end portion of the first reflective portion, wherein the peripheral portion of the second reflective portion indicates a portion within a range of D2/8 from an end portion of the second reflective portion toward a barycenter of the second reflective portion, and the central portion of the second reflective portion indicates a portion within a range of D2/3 from the barycenter of the second reflective portion where D2 represents a distance from the barycenter of the second reflective portion to the end portion of the second reflective portion, wherein each of the plurality of reflective portions is arranged under a corresponding one of the plurality of lower electrodes, and each of the plurality of lower electrodes and a corresponding one of the plurality of reflective portions are electrically connected to each other, and wherein in a plurality of peripheral portions including the peripheral portion of the first reflective portion and the peripheral portion of the second reflective portion, conductive layers are provided on the reflective film, and each of the plurality of lower electrodes is electrically connected to a corresponding one of the conductive layers.

15. The organic device according to claim 14, wherein the first insulating film includes a first film and a second film, the first film and the second film are arranged in the central portion of the first reflective portion, and not the first film but the second film is arranged in the central portion of the second reflective portion.

16. The organic device according to claim 15, wherein in a region where both the first film and the second film exist, the second film is arranged on the first film.

17. The organic device according to claim 14, wherein the first insulating film includes a first film, a second film, and a third film, the first film, the second film, and the third film are arranged in the central portion of the first reflective portion, not the first film but the second film and the third film are arranged in the central portion of the second reflective portion, and not the first film and the second film but the third film is arranged in the central portion of the third reflective portion.

18. The organic device according to claim 14, wherein each of the plurality of lower electrodes is electrically connected to a peripheral portion of a corresponding one of the plurality of reflective portions by a first conductive plug passing through the first insulating film.

19. The organic device according to claim 14, wherein the organic device is configured as a display device.

20. A display image capturing device comprising:
an image capturing device; and
an organic device defined in claim 14 and configured as a display device,
wherein a displayed image on the display device is controlled based on line-of-sight information of a user provided from the image capturing device.

21. An image capturing device comprising:
an optical unit having a plurality of lenses;
an image sensor configured to receive light having passed through the optical unit; and
a display unit configured to display an image captured by the image sensor,
wherein the display unit includes an organic device defined in claim 14.

22. An electronic apparatus comprising:
a display unit including an organic device defined in claim 14;
a housing provided with the display unit; and
a communication unit provided in the housing and configured to perform external communication.

23. An illumination device comprising:
a light source including an organic device defined in claim 14; and
one of a light-diffusing unit and an optical film configured to transmit light emitted by the light source.

24. A moving body comprising:
a lighting appliance including an organic device defined in claim 14; and
a main body provided with the lighting appliance.

* * * * *